(12) United States Patent
Lee et al.

(10) Patent No.: US 12,387,631 B2
(45) Date of Patent: *Aug. 12, 2025

(54) DISPLAY DEVICE HAVING IMPROVED DISPLAY QUALITY AND IMPROVED PRODUCT RELIABILITY, AND METHOD OF MANUFACTURING THE SAME

(71) Applicant: SAMSUNG DISPLAY CO., LTD., Yongin-si (KR)

(72) Inventors: Hyoungwook Lee, Seoul (KR); Yewon Cho, Hwaseong-si (KR); Hojin Kang, Suwon-si (KR); Muhyun Kim, Seoul (KR); Jinhwan Kim, Seoul (KR)

(73) Assignee: Samsung Display Co., Ltd., Yongin-si (KR)

( * ) Notice: Subject to any disclaimer, the term of this patent is extended or adjusted under 35 U.S.C. 154(b) by 516 days.

This patent is subject to a terminal disclaimer.

(21) Appl. No.: 17/856,875

(22) Filed: Jul. 1, 2022

(65) Prior Publication Data

US 2022/0336762 A1 Oct. 20, 2022

Related U.S. Application Data

(63) Continuation of application No. 16/775,071, filed on Jan. 28, 2020, now Pat. No. 11,380,858.

(30) Foreign Application Priority Data

Mar. 13, 2019 (KR) .......................... 10-2019-0028574

(51) Int. Cl.
*G09F 9/30* (2006.01)
*H04M 1/02* (2006.01)
(Continued)

(52) U.S. Cl.
CPC .......... *G09F 9/301* (2013.01); *H04M 1/0268* (2013.01); *H10K 50/844* (2023.02); *H10K 50/86* (2023.02);
(Continued)

(58) Field of Classification Search
CPC .... H10K 77/111; H10K 50/844; H10K 50/86; H10K 59/12; H10K 71/00;
(Continued)

(56) References Cited

U.S. PATENT DOCUMENTS 9,276,055 B1 3/2016 Son et al.
10,224,498 B2 3/2019 Um et al.
(Continued)

FOREIGN PATENT DOCUMENTS

| CN | 107887338 A | 4/2018 |
|----|-------------|--------|
| CN | 108288632 A | 7/2018 |

(Continued)

*Primary Examiner* — J. E. Schoenholtz
(74) *Attorney, Agent, or Firm* — Womble Bond Dickinson (US) LLP

(57) ABSTRACT

A display device according to an embodiment of the present disclosure may include a substrate, a display element layer on the substrate, an encapsulation layer on the display element layer to seal the display element layer, a polarizing layer on the encapsulation layer, a first protection layer on the substrate and spaced apart from the polarizing layer, and a second protection layer on the substrate and covering a portion of the first protection layer, wherein the first protection layer has a thickness that is greater than a thickness of the second protection layer.

9 Claims, 17 Drawing Sheets

(51) Int. Cl.
  *H10K 50/844* (2023.01)
  *H10K 50/86* (2023.01)
  *H10K 59/12* (2023.01)
  *H10K 59/80* (2023.01)
  *H10K 71/00* (2023.01)
  *H10K 77/10* (2023.01)
  *H10K 102/00* (2023.01)

(52) U.S. Cl.
  CPC ........... *H10K 59/12* (2023.02); *H10K 59/873* (2023.02); *H10K 59/8791* (2023.02); *H10K 71/00* (2023.02); *H10K 77/111* (2023.02); *H10K 2102/311* (2023.02)

(58) Field of Classification Search
  CPC ........... H10K 2102/311; H10K 59/873; H10K 59/8791; H10K 2102/351; H04M 1/0268; G06F 1/1652; G09F 9/301; G09F 9/33
  See application file for complete search history.

(56) References Cited

U.S. PATENT DOCUMENTS

| | | |
|---|---|---|
| 10,333,087 B2 | 6/2019 | Choi et al. |
| 10,388,713 B2 | 8/2019 | Son et al. |
| 11,380,858 B2 * | 7/2022 | Lee .................. H10K 59/12 |
| 2015/0177789 A1 | 6/2015 | Jinbo |
| 2019/0079347 A1 | 3/2019 | Fuchida et al. |
| 2019/0094610 A1 | 3/2019 | Yukawa et al. |
| 2019/0235144 A1 | 8/2019 | Morozov et al. |
| 2020/0303490 A1 | 9/2020 | Tomioka et al. |

FOREIGN PATENT DOCUMENTS

| | | |
|---|---|---|
| KR | 10-2017-0020626 A | 2/2017 |
| KR | 10-2018-0032719 A | 4/2018 |
| KR | 10-2018-0082717 | 7/2018 |
| KR | 10-2018-0111281 | 10/2018 |
| KR | 10-1899831 B1 | 11/2018 |

* cited by examiner

DISPLAY DEVICE HAVING IMPROVED DISPLAY QUALITY AND IMPROVED PRODUCT RELIABILITY, AND METHOD OF MANUFACTURING THE SAME

CROSS-REFERENCE TO RELATED APPLICATIONS

This application is a continuation of U.S. patent application Ser. No. 16/775,071, filed Jan. 28, 2020, which claims priority to and the benefit of Korean Patent Application No. 10-2019-0028574, filed Mar. 13, 2019, the entire content of both of which is incorporated herein by reference.

BACKGROUND

The present disclosure herein relates to a display device having improved display quality and improved product reliability, and a method of manufacturing the same.

Display devices are classified into a liquid crystal display (LCD) device, an organic light emitting diode display (OLED display) device, a plasma display panel (PDP) device, an electrophoretic display device, and the like.

In recent years, a flexible display device has been developed. Because a flexible display device may be used while being folded or bent, the flexible display device may be used in various fields. In the flexible display device, a display element may be on a flexible substrate.

The flexible display device may realize a narrow bezel by bending at least one side end of the display device. Here, a crack may be frequently generated in a metal line located at a bending area or in the flexible substrate. The crack generated in the flexible substrate or the metal line may cause a defect of the flexible display device.

SUMMARY

The present disclosure provides a display device having improved display quality and improved product reliability, and a method of manufacturing the same.

An embodiment of the present disclosure provides a display device including a substrate, a display element layer on the substrate, an encapsulation layer on the display element layer to seal the display element layer, a polarizing layer on the encapsulation layer, a first protection layer on the substrate and spaced apart from the polarizing layer, and a second protection layer on the substrate and covering a portion of the first protection layer, wherein the first protection layer has a thickness that is greater than a thickness of the second protection layer.

The substrate may include a first area, and a second area bent from the first area, wherein the polarizing layer is at the first area, and wherein the second protection layer is at the second area.

The first protection layer may overlap a boundary between the first area and the second area on a plane.

The display device may further include a support layer below the first area.

A portion of the support layer may overlap at least a portion of the first protection layer on a plane, wherein an overlapped area between the support layer and the first protection layer has a width of about 140 µm.

The second protection layer may be spaced apart from the polarizing layer with the first protection layer therebetween.

The first protection layer may be spaced apart from the display element layer and the encapsulation layer.

An embodiment of the present disclosure provides a display device includes a substrate, a display element layer on the substrate, an encapsulation layer on the display element layer to seal the display element layer, a polarizing layer on the encapsulation layer, and a first protection layer on the substrate and spaced apart from the polarizing layer, wherein a thickness between a top surface of the substrate and a top surface of the polarizing layer is the same as a thickness between the top surface of the substrate and a top surface of the first protection layer.

The substrate may include a first area, and a second area bent from the first area, wherein the polarizing layer is at the first area, and wherein the first protection layer is at at least a portion of the first area, and is at the second area.

The display device may further include a support layer below the substrate.

A portion of the support layer may overlap a portion of the first protection layer on a plane, wherein an overlapped area between the support layer and the first protection layer has a width of about 140 µm.

The display device may further include a second protection layer between the polarizing layer and the first protection layer on the substrate, and spaced apart from the polarizing layer.

The second protection layer may have a thickness that is greater than that of the first protection layer.

An embodiment of the present disclosure provides a method of manufacturing a display device includes forming a display element layer on a substrate, forming an encapsulation layer on the display element layer, forming a polarizing layer on the encapsulation layer, forming a first protection layer, which is spaced apart from the polarizing layer and has a first thickness, on the substrate, and forming a second protection layer, which is spaced apart from the polarizing layer with the first protection layer therebetween and has a second thickness that is less than the first thickness.

The substrate may include a first area on which the display element layer is located, and a second area on which the first protection layer and the second protection layer are located, wherein the method further includes bending the second area.

The forming of the first protection layer may include forming a first preliminary protection layer, and curing the first preliminary protection layer to form the first protection layer.

The first preliminary protection layer may include a photocurable resin.

The forming of the second protection layer may include forming a second preliminary protection layer configured to cover at least a portion of the first protection layer, and curing the second preliminary protection layer to form the second protection layer.

The second preliminary protection layer may include a photocurable resin.

The curing of the first preliminary protection layer may occur before the curing of the second preliminary protection layer

BRIEF DESCRIPTION OF THE FIGURES

The accompanying drawings are included to provide a further understanding of the present disclosure, and are incorporated in and constitute a part of this specification. The drawings illustrate embodiments of the present disclosure and, together with the description, serve to explain aspects of the present disclosure. In the drawings.

DETAILED DESCRIPTION

Figure 1:
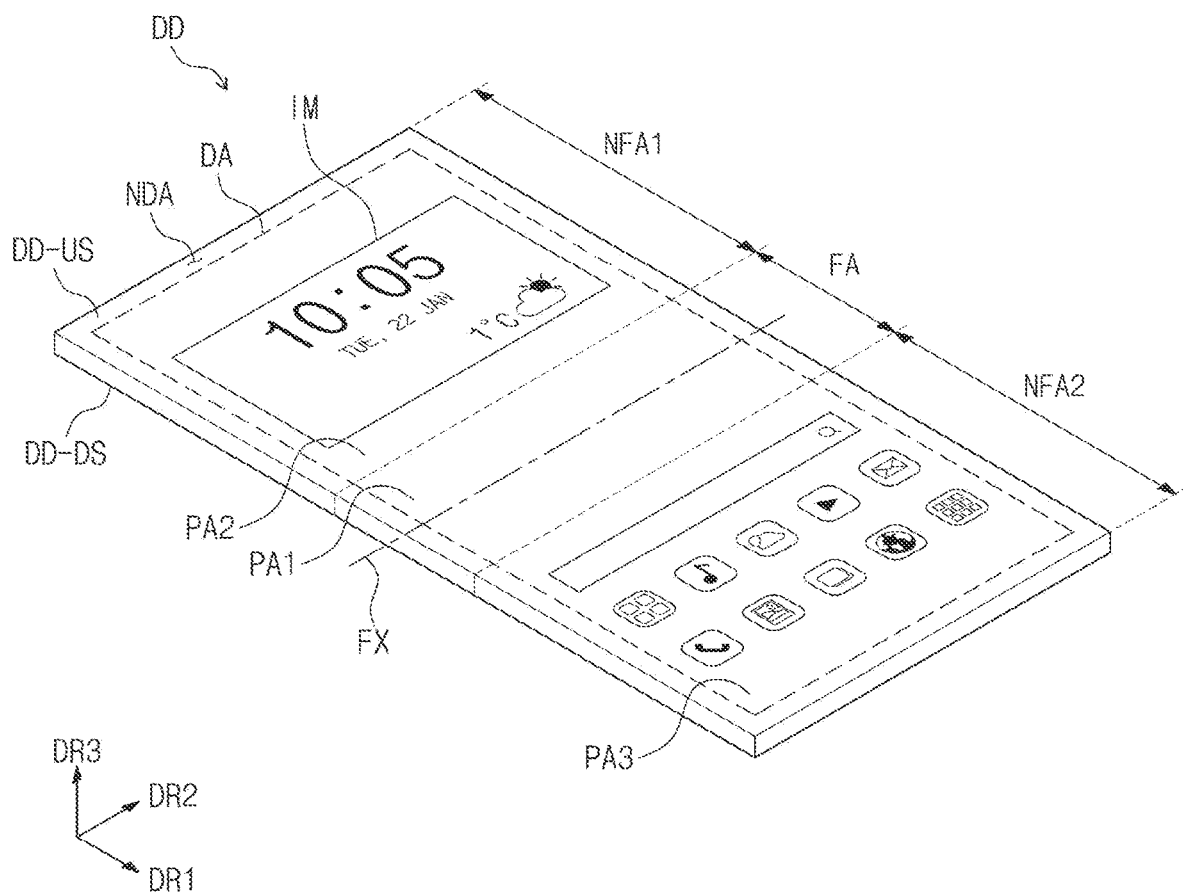
FIG. 1 is a perspective view illustrating a display device according to an embodiment of the present disclosure.

In this specification, it will also be understood that when one component (or region, layer, portion) is referred to as being "on," "connected to," or "coupled to" another component, it can be directly located/connected/coupled on/to the one component, or an intervening third component may also be present.

Like reference numerals refer to like elements throughout. Also, in the figures, the thickness, ratio, and dimensions of components are exaggerated for clarity of illustration.

The term "and/or" includes any and all combinations of one or more of the associated listed items.

It will be understood that although the terms such as "first" and "second" are used herein to describe various elements, these elements should not be limited by these terms. The terms are only used to distinguish one component from other components. For example, a first element referred to as a first element in one embodiment can be referred to as a second element in another embodiment without departing from the scope of the appended claims. The terms of a singular form may include plural forms unless referred to the contrary.

Also, "under," "below," "above," "upper," and the like are used for explaining relation association of components illustrated in the drawings. The terms may be a relative concept and described based on directions expressed in the drawings.

Unless otherwise defined, all terms (including technical and scientific terms) used herein have the same meaning as generally understood by those skilled in the art. Terms as defined in a commonly used dictionary should be construed as having the same meaning as in an associated technical context, and unless defined apparently in the description, the terms are not ideally or excessively construed as having formal meaning.

The meaning of "include" or "comprise" specifies a property, a fixed number, a step, an operation, an element, a component or a combination thereof, but does not exclude other properties, fixed numbers, steps, operations, elements, components or combinations thereof.

Hereinafter, embodiments of the present disclosure will be described with reference to the accompanying drawings.

FIG. 1 is a perspective view illustrating a display device according to an embodiment of the present disclosure.

Referring to FIG. 1, a display device DD may include a plurality of areas distinguished on a display surface. The display surface is distinguished by a display area DA and a non-display area NDA that are determined according to whether an image IM is displayed. The display area DA is an area on which the image IM is displayed, and the non-display area NDA is an area on which the image IM is not displayed. For example, the display device DD in FIG. 1 may be provided as a smartphone having a rectangular shape. The display device DD may display the image IM showing weather information and icons. The non-display area NDA may be located adjacent to the display area DA, and/or may surround the display area DA. Also, the non-display area NDA may be omitted in other embodiments.

The display surface may be parallel to a surface defined by a first direction DR1 and a second direction DR2. A normal direction of the display surface may correspond to a third direction DR3, and may also correspond to a thickness direction of the display device DD. Front and rear surfaces of each of members may be distinguished by referencing the third direction DR3.

However, directions indicated by the first to third directions DR1, DR2, and DR3 may be a relative concept, and may be converted with respect to each other. Hereinafter, first to third directions may be indicated by the first to third directions DR1, DR2, and DR3, and may be designated by the same reference numerals, respectively. Also, in this specification, a surface defined by the first direction DR1 and the second direction DR2 may be defined as a plane, and an expression of "viewed on the plane" may be defined by a state of being viewed in the third direction DR3 (e.g., a plan view).

The third direction DR3 may cross each of the first and second directions DR1 and DR2. The first direction DR1, the second direction DR2, and the third direction DR3 may be perpendicular to each other.

The display device DD may include a folding area FA that may be folded with respect to a folding axis FX, and may include a first non-folding area NFA1 and a second non-folding area NFA2 that are spaced apart from each other with the folding area FA therebetween. The folding axis FX may extend in the second direction DR2. The first non-folding area NFA1 may extend from one end of the folding area FA in the first direction DR1 (e.g., in a direction opposite to the first direction DR1). The second non-folding area NFA2 may extend from the other end of the folding area FA in the first direction DR1.

A top surface DD-US of the display device DD may include a first display surface PA1 overlapping the folding area FA, a second display surface PA2 overlapping the first non-folding area NFA1, and a third display surface PA3 overlapping the second non-folding area NFA2. A bottom surface DD-DS of the display device DD may be opposite to the top surface DD-US. Each of the first to third display surfaces PA1, PA2, and PA3 may display an image.

In an embodiment of the present disclosure, although the display device DD is illustrated as a foldable display device, as an example, the present disclosure is not limited thereto. For example, the display device may include various display devices, such as a flexible display device, a curved display device, a rollable display device, and/or a stretchable display device. Also, the display device according to an embodiment of the present disclosure may be used in large-sized electronic devices, such as a television or an outdoor advertisement board, and/or a small and medium sized electronic devices such as a personal computer, a notebook computer, a personal digital terminal, a navigation unit for vehicles, a game console, a portable electronic device, a wrist watch type electronic device, and a camera.

Figure 2:
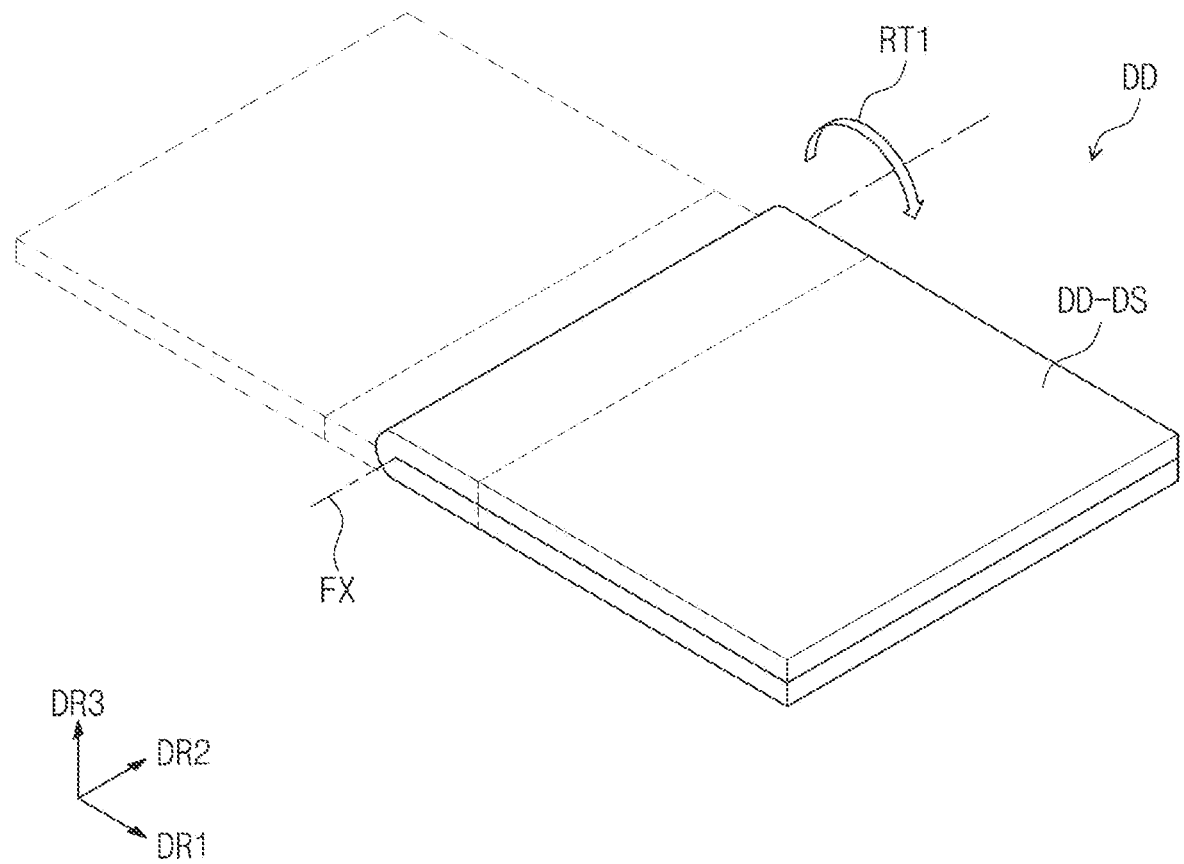
FIG. 2 is a perspective view illustrating the display device folded with respect to a folding axis according to an embodiment of the present disclosure.

FIG. 2 is a perspective view illustrating the display device folded with respect to a folding axis according to an embodiment of the present disclosure.

Referring to FIGS. 1 and 2, the folding area FA may be folded with respect to the folding axis FX so that the second display surface PA2 and the third display surface PA3 face each other. The folding area FA may be folded with respect to a first rotational direction RT1. The bottom surface DD-DS of the display device DD may remain exposed to the outside when the display device DD is folded along the folding axis FX in the manner shown in FIG. 2, which may be defined as inner folding.

Figure 3:
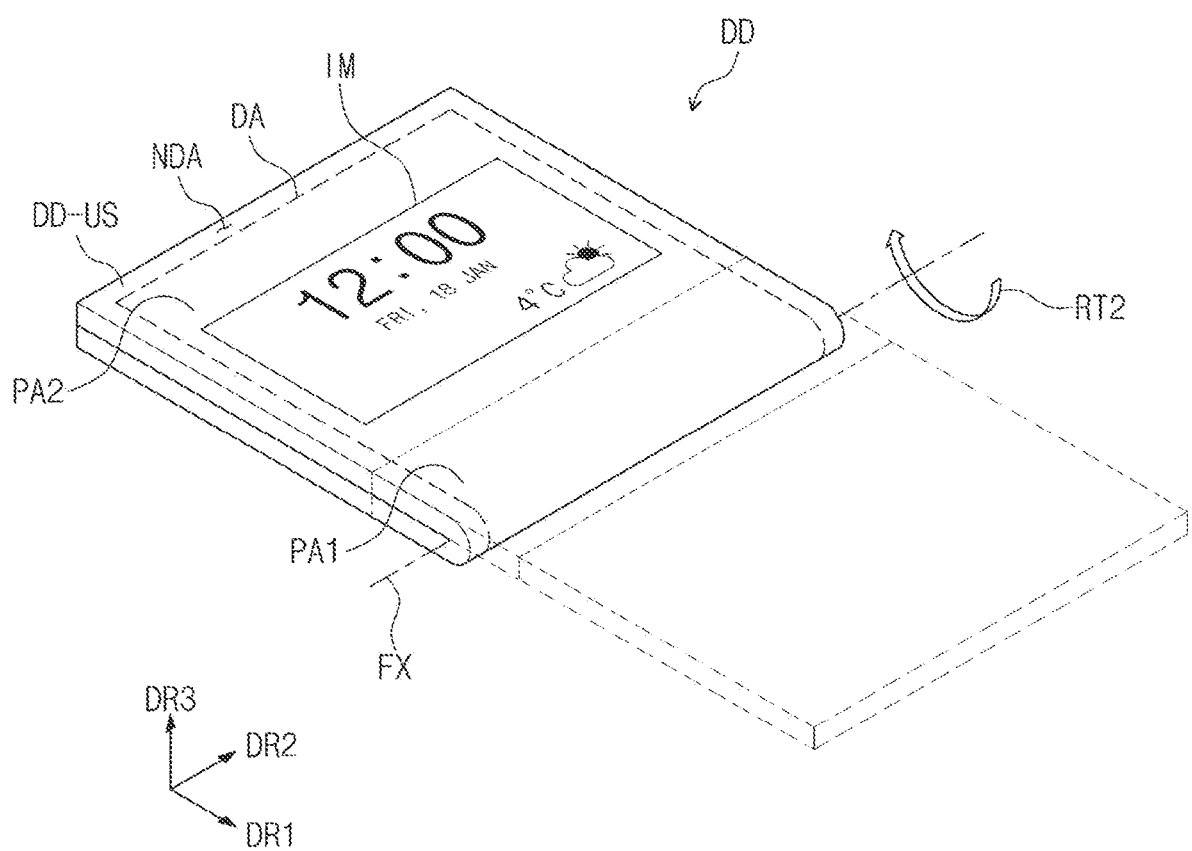
FIG. 3 is a perspective view illustrating the display device folded with respect to the folding axis according to an embodiment of the present disclosure.

FIG. 3 is a perspective view illustrating the display device folded with respect to the folding axis according to an embodiment of the present disclosure.

Referring to FIGS. 1 and 3, the folding area FA may be folded with respect to the folding axis FX so that the second display surface and the third display surface are exposed to the outside. The folding area FA may be folded along a second rotational direction RT2, and the top surface DD-US of the display device DD may remain exposed to the outside.

The display device DD may be folded along the folding axis FX so that each of the second display surface PA2 of the first non-folding area NFA1 and the third display surface PA3 of the second non-folding area NFA2 faces to the outside, and this may be defined as outer folding.

Figure 4:
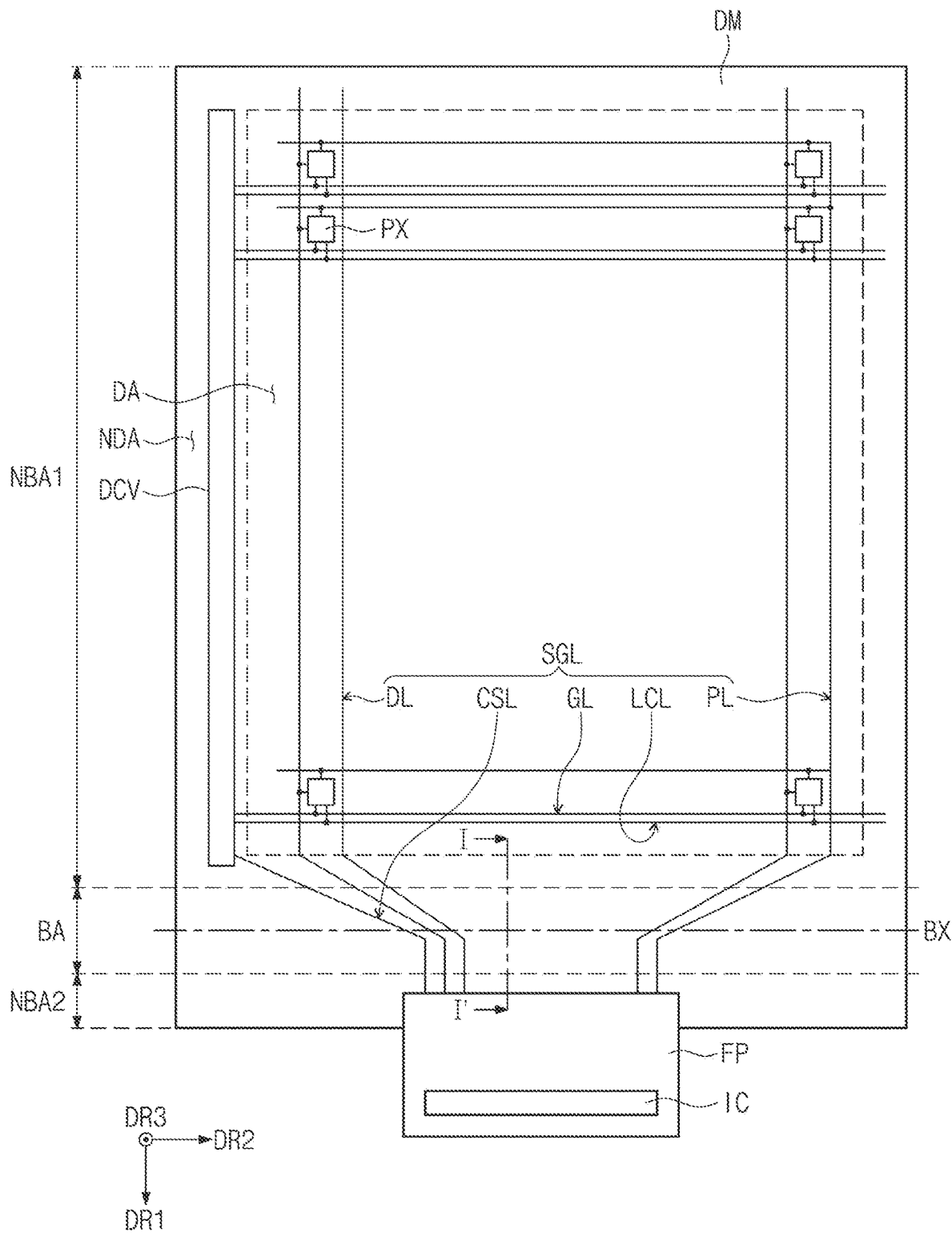
FIG. 4 is a plan view illustrating the display device according to an embodiment of the present disclosure.

FIG. 4 is a plan view illustrating the display device according to an embodiment of the present disclosure.

Referring to FIG. 4, the display device DD (refer to FIG. 1) may include a display module DM, a circuit board FP, and a driving element IC.

Although a display module DM according to an embodiment of the present disclosure may be a light emitting display module, the present disclosure is not particularly limited thereto. For example, the display module DM may be an organic light emitting display module or a quantum dot light emitting display module. The organic light emitting display module may include a light emitting layer containing an organic light emitting material. The quantum dot light emitting display module may include a light emitting layer containing a quantum dot and a quantum rod. Hereinafter, the display module DM will be described as an organic light emitting display module.

The display module DM may include a scan driving circuit DCV, signal lines SGL, and pixels PX. An area in which the pixels PX are located may be defined as the display area DA.

The scan driving circuit DCV may be at the non-display area NDA. The scan driving circuit DCV may generate scan signals. The scan signals may be sequentially outputted to gate lines GL. The scan driving circuit DCV may further output other control signals to a driving circuit of the pixels PX.

The scan driving circuit DCV may include thin-film transistors that are formed through the same process used for forming the driving circuit of the pixels PX. For example, the process may include a low temperature polycrystalline silicon (LTPS) process or a low temperature polycrystalline oxide (LTPO) process.

The signal lines SGL may include a conductive material. The signal lines SGL may include a metal material having flexibility to reduce or minimize damage generated when a substrate SUB is bent. For example, each of the signal lines SGL may be made of a conductive material having excellent ductility such as gold (Au), silver (Ag), aluminum (Al), and copper (Cu). However, the present disclosure is not limited to the material of the signal lines SGL. For example, each of the signal lines SGL may be made of one of various conductive materials used for manufacturing of the display device DD (refer to FIG. 1).

The signal lines SGL may include data lines DL, a power line PL, a control signal line CSL, gate lines GL, and light emission control lines LCL.

Each of the data lines DL may be connected to one or more corresponding pixels of the pixels PX. Each of the pixels PX may be connected to a corresponding data line of the data lines DL.

The power line PL may be connected to the pixels PX. The control signal line CSL may provide control signals to the scan driving circuit DCV.

Each of the gate lines GL may extend in the second direction DR2. Each of the gate lines GL may be connected to one or more corresponding pixels of the pixels PX. The gate lines GL may be connected to the scan driving circuit DCV.

Each of the light emission control lines LCL may extend in the second direction DR2. Each of the light emission control lines LCL may be connected to one or more corresponding pixels of the pixels PX. The light emission control lines LCL may be connected to the scan driving circuit DCV.

Some of the data lines DL, the power line PL, the control signal line CSL, and the gate lines GL may be at a same layer as each other, and some thereof may be at different layers from each other.

The display module DM may include a first area NBA1, a second area BA, and a third area NBA2. A bending axis BX may be substantially parallel to the second direction DR2. The second area BA may be bent with respect to the bending axis BX. The first area NBA1 and the third area NBA2 may be spaced apart from each other with the second area BA therebetween.

The first area NBA1, as an area for displaying an image, may include the folding area FA, the first non-folding area NFA1, and the second non-folding area NFA2, which are described with respect to FIG. 1.

A portion of the circuit board FP may be at the third area NBA2. The circuit board FP may be electrically connected to the display module DM through the plurality of signal lines SGL. For example, the circuit board FP may be electrically connected to a circuit element layer DP-CL (refer to FIG. 6) including the signal lines SGL.

The driving element IC may be at the circuit board FP. The driving element IC may output driving signals and image signals for displaying an image. The driving element IC may be electrically connected to conductive patterns that are at one area of the circuit board FP. The image signals and driving signals outputted from the driving element IC may be transmitted to the display module DM (refer to FIG. 1) through the circuit board FP. Although one driving element IC is at the circuit board FP in FIG. 4, the present disclosure is not limited thereto. A plurality of driving elements for displaying an image may be at the circuit board FP.

Figure 5:
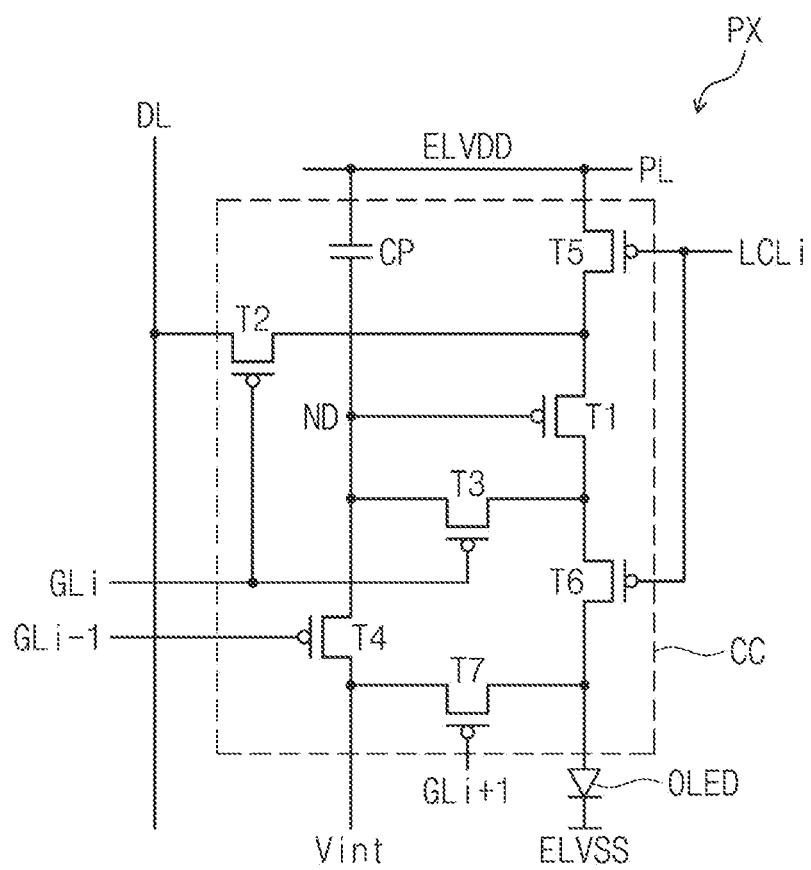
FIG. 5 is an equivalent circuit diagram illustrating one pixel of the plurality of pixels according to an embodiment of the present disclosure.

FIG. 5 is an equivalent circuit diagram illustrating one pixel of the plurality of pixels according to an embodiment of the present disclosure.

In FIG. 5, the pixel PX connected to an i-th gate line GLi and an i-th light emission control line LCLi is illustrated as an example. However, the present disclosure is not limited to the configuration of the pixel PX of the present embodiment. For example, the configuration of the pixel PX may be variously changed.

Referring to FIG. 5, the pixel may include a light emitting element OLED and a pixel circuit CC. The pixel circuit CC may include a plurality of transistors T1 to T7 and a capacitor CP. The pixel circuit CC controls a current amount flowing through the light emitting element OLED corresponding to the data signal.

The light emitting element OLED may emit light (e.g., light with predetermined luminance) corresponding to the amount of current provided from the pixel circuit CC. A first power ELVDD may have a voltage or power level that is greater than that of a second power ELVSS.

Each of the plurality of transistors T1 to T7 may include an input electrode (or source electrode), an output electrode (or drain electrode), and a control electrode (or gate electrode). In the present disclosure, for convenience, one of the input electrode and the output electrode may be referred to as a first electrode, and the other may be referred to as a second electrode.

A first electrode of the first transistor T1 may be connected to the fifth transistor T5 to be electrically connected to the first power ELVDD. A second electrode of the first transistor T1 may be connected to the sixth transistor T6 to be electrically connected to an anode electrode of the light emitting element OLED. The first transistor T1 may be referred to as a driving transistor in this specification.

The first transistor T1 may control an amount of current flowing to the light emitting element OLED corresponding to a voltage applied to a control electrode of the first transistor T1.

The second transistor T2 may be connected between the data line DL and the first electrode of the first transistor T1. A control electrode of the second transistor T2 may be connected to an i-th gate line GLi. When an i-th gate signal is provided to the i-th gate line GLi, the second transistor T2 may be turned on to electrically connect the data line DL and the first electrode of the first transistor T1.

The third transistor T3 may be connected between the second electrode of the first transistor T1 and the control electrode of the first transistor T1. A control electrode of the third transistor T3 may be connected to the i-th gate line GLi. When the i-th gate signal is provided to the i-th gate line GLi, the third transistor T3 may be turned on to electrically connect the second electrode of the first transistor T1 and the control electrode of the first transistor T1. When the third transistor T3 is turned on, the first transistor T1 may be diode connected/connected in a diode form.

The fourth transistor T4 may be connected between a node ND and an initialization power generation part for providing an initialization voltage Vint. A control electrode of the fourth transistor T4 may be connected to an i−1-th gate line GLi−1. When an i−1-th gate signal is provided to the i−1-th gate line GLi−1, the fourth transistor T4 may be turned on and provide the initialization voltage Vint to the node ND.

The fifth transistor T5 may be connected between the power line PL and the first electrode of the first transistor T1. A control electrode of the fifth transistor T5 may be connected to an i-th light emission control line LCLi.

The sixth transistor T6 may be connected between the second electrode of the first transistor T1 and the anode electrode of the light emitting element OLED. A control electrode of the sixth transistor T6 may be connected to the i-th light emission control line LCLi.

The seventh transistor T7 may be connected between the initialization power generation part and the anode electrode of the light emitting element OLED. A control electrode of the seventh transistor T7 may be connected to an i+1-th gate line GLi+1. When an i+1-th gate signal is provided to the i+1-th gate line GLi+1, the seventh transistor T7 may be turned on, and may provide the initialization voltage Vint to the anode electrode of the light emitting element OLED.

The seventh transistor T7 may improve a black color expression capability of the pixel PX. When the seventh transistor T7 is turned on, a parasitic capacitor of the light emitting element OLED may be discharged. When black luminance is realized, the light emitting element OLED might not emit light due to a leakage current from the first transistor T1, and thus the black color expression capability may improve.

Although the control electrode of the seventh transistor T7 is connected to the i+1-th gate line GLi+1 in FIG. 5, the present disclosure is not limited thereto. In another embodiment of the present disclosure, the control electrode of the seventh transistor T7 may be connected to the i-th gate line GLi or the i−1-th gate line GLi−1.

Although FIG. 5 is illustrated on the basis of PMOS transistors being used, the present disclosure is not limited thereto. In another embodiment of the present disclosure, the pixel circuit CC may be configured using NMOS transistors. In another embodiment of the present disclosure, the pixel PX may be configured by a combination of NMOS and PMOS transistors.

The capacitor CP may be located between the power line PL and the node ND. The capacitor CP may store a voltage corresponding to the data signal. According to the voltage stored in the capacitor CP, a current amount flowing through the first transistor T1 when the fifth transistor T5 and the sixth transistor T6 are turned on may be determined. The present disclosure is not limited to the equivalent circuit diagram in FIG. 5. In another embodiment of the present disclosure, the pixel PX may be realized in various forms for allowing the light emitting element OLED to emit light.

Figure 6:
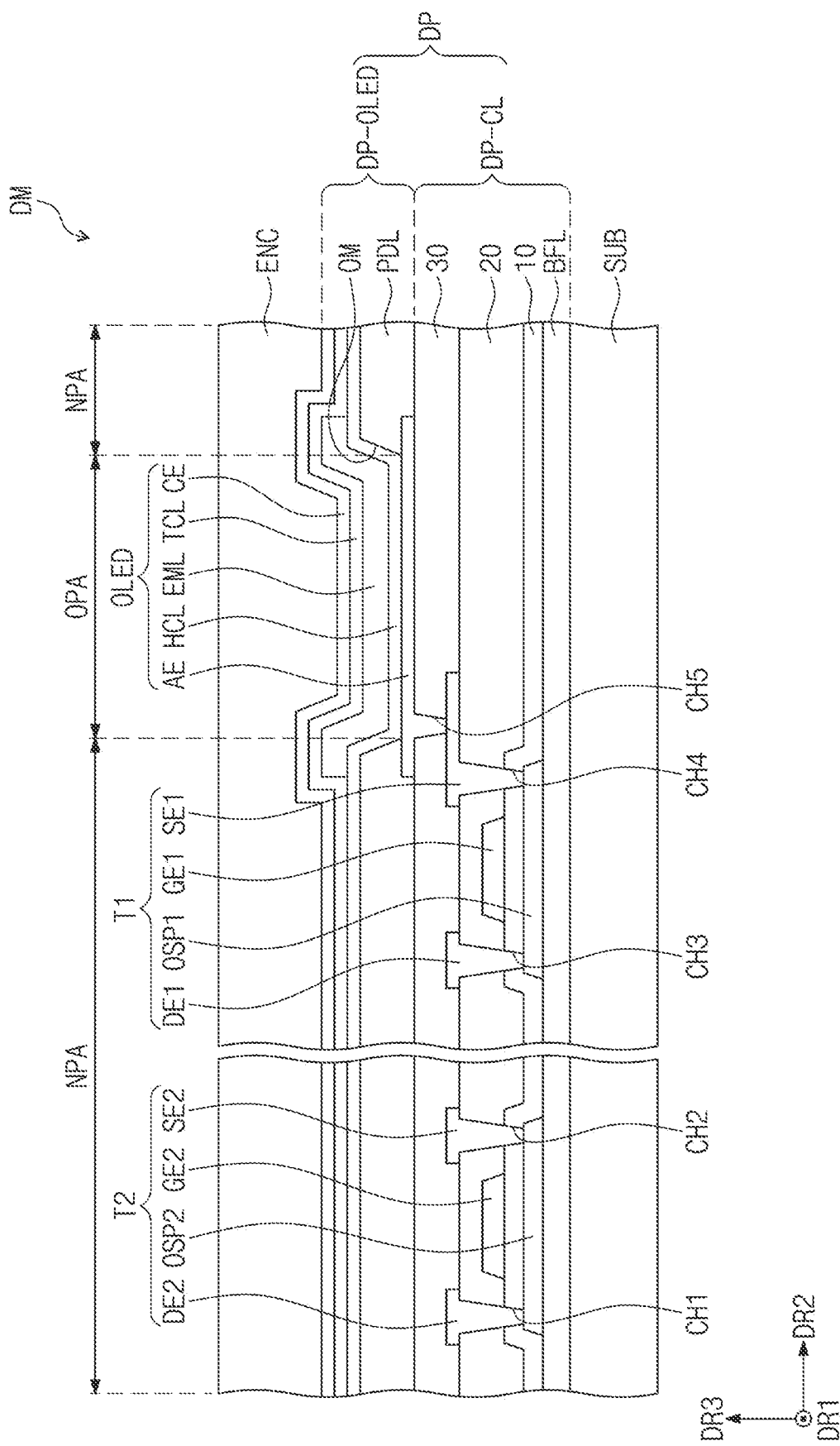
FIG. 6 is a cross-sectional view illustrating a display module according to an embodiment of the present disclosure.

FIG. 6 is a cross-sectional view illustrating the display module according to an embodiment of the present disclosure.

Referring to FIG. 6, a substrate SUB may be made of a ductile material. For example, the substrate SUB may have a film shape including one selected from the group consisting of a polyester-based polymer, a silicon-based polymer, an acrylic-based polymer, a polyolefin-based polymer, and a copolymer thereof. However, the present disclosure is not limited to the material of the substrate SUB. For example, the substrate SUB may be made of a glass material.

On the substrate SUB, a display element layer DP and an encapsulation layer ENC may be sequentially located.

The display element layer DP may include a circuit element layer DP-CL and a light emitting element layer DP-OLED.

The circuit element layer DP-CL may include the signal lines SGL (refer to FIG. 4). The circuit element layer DP-CL may include a buffer layer BFL, a first intermediate inorganic layer 10 and a second intermediate inorganic layer 20, which are inorganic layers, and an intermediate organic layer 30 that is an organic layer. However, the present disclosure is not particularly limited to the material of each of the inorganic and organic layers.

The buffer layer BFL may provide a flat surface on the substrate SUB, and may block impurity elements from being introduced to the substrate SUB. In an embodiment of the present disclosure, the buffer layer BFL may be selectively provided or omitted.

On the buffer layer BFL, a first semiconductor pattern OSP1 of the first transistor T1 and a second semiconductor pattern OSP2 of the second transistor T2 may be located. Each of the first semiconductor pattern OSP1 and the second semiconductor pattern OSP2 may include polysilicon or amorphous silicon. Each of the first semiconductor pattern OSP1 and the second semiconductor pattern OSP2 may include a metal oxide semiconductor.

The first intermediate inorganic layer 10 may be on the first semiconductor pattern OSP1 and the second semiconductor pattern OSP2. A first control electrode GE1 of the first transistor T1 and a second control electrode GE2 of the second transistor T2 may be located on the first intermediate inorganic layer 10.

The second intermediate inorganic layer 20 covering the first control electrode GE1 and the second control electrode GE2 may be located on the first intermediate inorganic layer 10. A first input electrode DE1 and a first output electrode SE1 of the first transistor T1 and a second input electrode DE2 and a second output electrode SE2 of the second transistor T2 may be located on the second intermediate inorganic layer 20.

The second input electrode DE2 and the second output electrode SE2 may be connected to the second semiconductor pattern OSP2 through a first through-hole CH1 and a second through-hole CH2, respectively, which pass through the first inorganic layer 10 and the second inorganic layer 20. The first input electrode DE1 and the first output electrode SE1 may be connected to the first semiconductor pattern OSP1 through a third through-hole CH3 and a fourth through-hole CH4, respectively, which pass through the first inorganic layer 10 and the second inorganic layer 20. For example, in another embodiment of the present disclosure, one of the first transistor T1 and the second transistor T2 may have a bottom gate structure.

An intermediate organic layer 30 covering the first input electrode DE1, the second input electrode DE2, the first output electrode SE1, and the second output electrode SE2 may be located on the second intermediate inorganic layer 20. The intermediate organic layer 30 may provide a flat surface.

A light emitting element layer DP-OLED may be located on the intermediate organic layer 30. The light emitting element layer DP-OLED may include a pixel defining layer PDL and a light emitting element OLED. For example, the light emitting element OLED may include an organic light emitting diode. The pixel defining layer PDL may include an organic material.

A first electrode AE may be on the first intermediate organic layer 30. The first electrode AE may be electrically connected to the first output electrode SE1 through a fifth through-hole CH5 passing through the intermediate organic layer 30. Although the first electrode AE is directly connected to the first output electrode SE1 in FIG. 6, the first electrode AE may be electrically connected to the first output electrode SE1 through the sixth transistor T6 (refer to FIG. 5).

An opening OM may be defined in the pixel defining layer PDL. The opening OM of the pixel defining layer PDL may expose at least a portion of the first electrode AE.

In an embodiment of the present disclosure, a light emitting area OPA may overlap at least one of the first and second transistors T1 and T2. In other embodiments, the opening OM may increase in area/size, and the first electrode AE and the light emitting layer EML may also increase in area/size.

A hole control layer HCL may be located in the light emitting area OPA and the non-light emitting area NPA in common. A light emitting layer EML may be on the hole control layer HCL. The light emitting layer EML may be located in an area corresponding to the opening OM. The light emitting layer EML may contain an organic material and/or an inorganic material. The light emitting layer EML may generate colored light (e.g., colored light having a predetermined color).

An electron control layer TCL may be on the light emitting layer EML. A second electrode CE is located on the electron control layer TCL.

An encapsulation layer ENC may be on the second electrode CE. The encapsulation layer ENC may cover the second electrode CE. A capping layer covering the second electrode CE may be located between the encapsulation layer ENC and the second electrode CE in other embodiments. Here, the encapsulation layer ENC may directly cover the capping layer. The encapsulation layer ENC may be provided as a single encapsulation layer or as a plurality of thin-films.

Figure 7A:
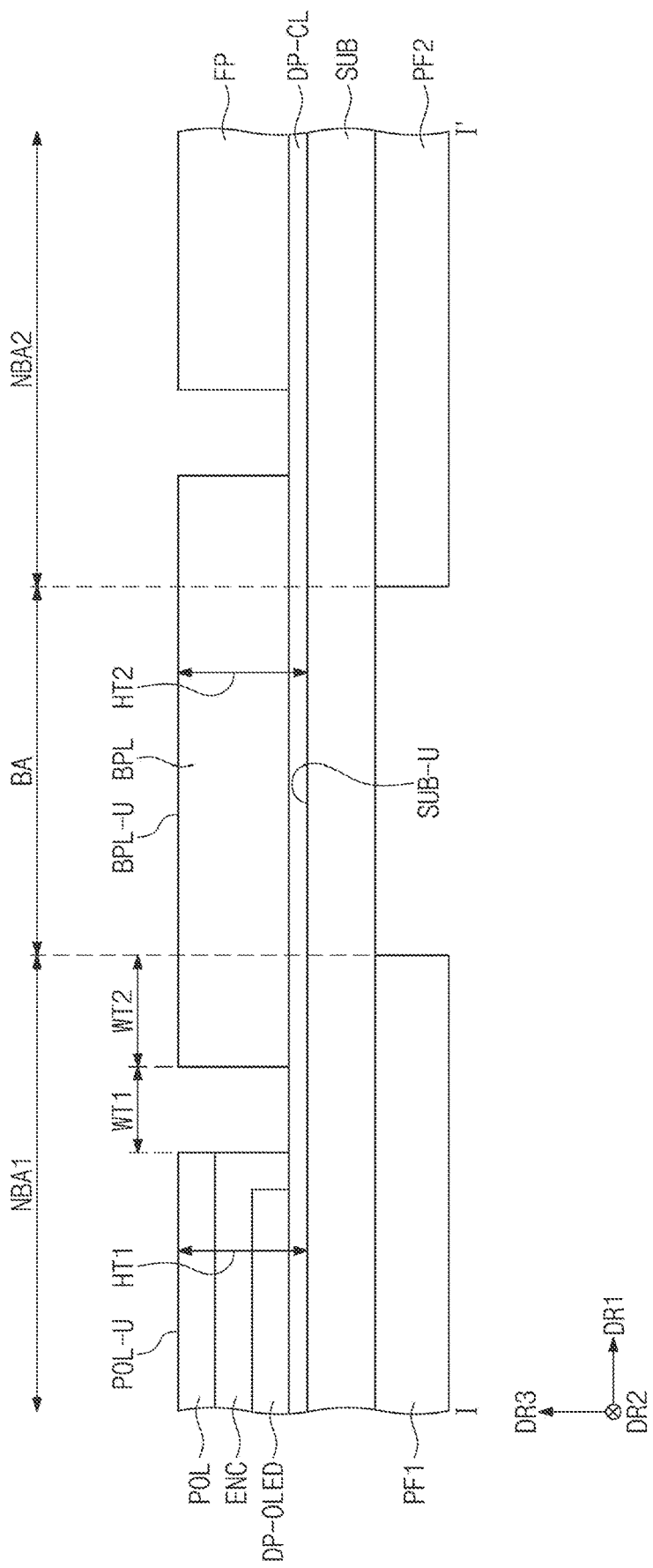
FIG. 7A is a cross-sectional view illustrating the display device taken along the line I-I' in FIG. 4 according to an embodiment of the present disclosure.
Figure 7B:
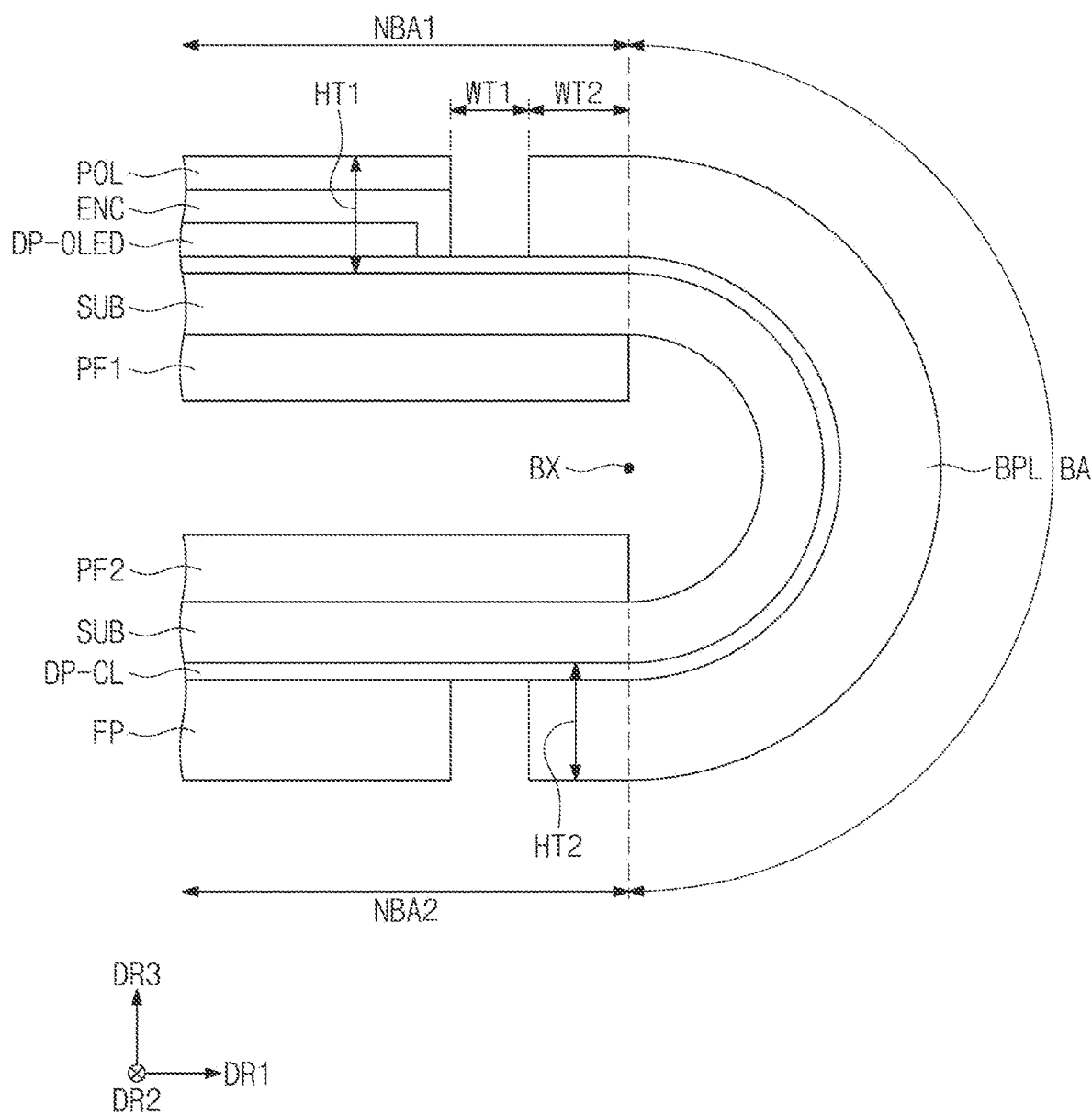
FIG. 7B is a cross-sectional view illustrating a state in which the display device in FIG. 7A is bent with respect to a bending axis.

FIG. 7A is a cross-sectional view illustrating the display device taken along the line I-I' in FIG. 4 according to an embodiment of the present disclosure, and FIG. 7B is a cross-sectional view illustrating a state in which the display device in FIG. 7A is bent with respect to a bending axis.

Referring to FIGS. 7A and 7B, the display device DD (refer to FIG. 1) may include a substrate SUB, a light emitting element layer DP-OLED, an encapsulation layer ENC, a polarizing layer POL, a protection layer BPL, a circuit element layer DP-CL, a circuit board FP, a first support layer PF1, and a second support layer PF2.

The substrate SUB may include a first area NBA1, a second area BA bent from the first area NBA1, and a third area NBA2 extending from the second area BA.

The light emitting element layer DP-OLED may be on the substrate SUB. The light emitting element layer DP-OLED may be at the first area NBA1.

The encapsulation layer ENC may be on the light emitting element layer DP-OLED. The encapsulation layer ENC may be at the first area NBA1. The encapsulation layer ENC may reduce or prevent the introduction of external air, such as moisture and oxygen, to the light emitting element layer DP-OLED. Also, in other embodiments, a barrier film for protecting the light emitting element layer DP-OLED may be additionally laminated on the encapsulation layer ENC.

The polarizing layer POL may be on the encapsulation layer ENC. The polarizing layer POL may cover an entire top surface of the encapsulation layer ENC. The polarizing layer POL may be at the first area NBA1. The polarizing layer POL may compensate optical characteristics of the display device DD (refer to FIG. 1). For example, the polarizing layer POL may reduce a reflectance of external light incident from the outside. In some embodiments, among light transmitted from the outside, the polarizing layer POL may transmit only specific polarized light, and may absorb or block the rest of the light transmitted from the outside. Also, the polarizing layer POL may reduce or prevent external light reflection.

The protection layer BPL may be on the substrate SUB. The protection layer BPL may be at at least a portion of the first area NBA1, at at least a portion of the third area NBA2, and at the second area BA. The protection layer BPL may reduce or prevent damage to the circuit element layer DP-CL at the second area BA of the substrate SUB.

The protection layer BPL may be spaced apart from the encapsulation layer ENC and the display element layer DP in the first direction DR1. The protection layer BPL may be spaced apart from the polarizing layer POL in the first direction DR1. For example, a width WT1 between the protection layer BPL and the polarizing layer POL may be about 10 μm or more.

According to an embodiment of the present disclosure, a protection film POL-P (refer to FIG. 10) protecting the polarizing layer POL may be on a top surface of the polarizing layer POL. The polarizing layer POL and the protection film POL-P (refer to FIG. 10) may be spaced apart from the protection layer BPL. Accordingly, the protection layer BPL may be prevented from protruding further than the polarizing layer POL by contacting with the protection film POL-P (refer to FIG. 10) and the polarizing layer POL by a surface tension with the protection film POL-P (refer to FIG. 10). Thus, the window at the polarizing layer POL may be prevented from being curved/deformed by protruded protection layer BPL, and a product reliability of the display device DD (refer to FIG. 1) may improve.

A thickness HT1 between a top surface SUB-U of the substrate SUB and a top surface POL-U of the polarizing layer POL may be the same as a thickness HT2 between the top surface SUB-U of the substrate SUB and a top surface BPL-U of the protection layer BPL.

The circuit element layer DP-CL may be on the substrate SUB. The circuit element layer DP-CL may electrically connect the light emitting element layer DP-OLED of the first area NBA1 and the circuit board FP of the third area NBA2.

The circuit board FP may be on the substrate SUB. The circuit board FP may be at the third area NBA2. The circuit board FP may transmit a driving signal received from the driving element IC (refer to FIG. 4) to the display element layer DP through the signal lines SGL. The circuit board FP may include a printed circuit board (PCB) or a flexible printed circuit board (FPCB). The circuit board FP may be spaced apart from the protection layer BPL in the first direction DR1.

On a plane, at least a portion of the first area NBA1 may overlap at least a portion of the protection layer BPL. For example, a width WT2 of an overlapped area in which the first area NBA1 overlaps the protection layer BPL may be in a range from about 140 μm to about 550 μm.

For example, when the width WT2 of the overlapped area in which the first area NBA1 overlaps the protection layer BPL is less than about 140 μm, unlike the present embodiment, the protection layer BPL may be separated from the substrate SUB by a force applied when the substrate SUB is bent. However, according to the present embodiment, the protection layer BPL may be adhered to the first area NBA1 when the width WT2 is about 140 μm or more. Accordingly, the protection layer BPL may be sufficiently adhered to the substrate SUB so that a portion of the protection layer BPL at the first area NBA1 is not bent. The protection layer BPL may allow a neutral surface provided at the circuit element layer DP-CL when the substrate SUB is bent. The protection layer BPL may prevent a crack from being generated in the circuit element layer DP-CL. Thus, the display device DD (refer to FIG. 1) may have improved reliability and improved display quality.

For example, unlike the present embodiment, when the width WT2 of the overlapped area between the first area NBA1 and the protection layer BPL exceeds about 550 μm on the plane, the protection layer BPL may contact the polarizing layer POL. The protection film POL-P (refer to FIG. 10) protecting the polarizing layer POL may be on the top surface of the polarizing layer POL. When the width WT2 exceeds about 550 μm, the protection layer BPL may contact the protection film POL-P (refer to FIG. 10). And the polarizing layer POL may protrude further than the polarizing layer POL by a surface tension with the protection film POL-P (refer to FIG. 10). Thus, the window at the polarizing layer POL may be curved/deformed by protruded protection layer BPL. However, according to an embodiment of the present disclosure, the protection layer BPL may be prevented from protruding further than the polarizing layer POL by the surface tension with the protection film POL-P (refer to FIG. 10) because the polarizing layer POL and the protection layer BPL are spaced apart from each other. Also, the window at the polarizing layer POL may be prevented from being curved/deformed by protruded protection layer BPL. Thus, a product reliability of the display device DD (refer to FIG. 1) may improve.

The first support layer PF1 may be on a rear surface of the substrate SUB. The first support layer PF1 may be at a portion corresponding to the first area NBA1. On a plane, at least a portion of the first support layer PF1 may overlap the polarizing layer POL. Also, the first support layer PF1 may overlap a portion of the protection layer BPL at the first area NBA1. For example, a width of an overlapped area in which the first support layer PF1 overlaps the protection layer BPL may be in a range from about 140 μm to about 550 μm. The first support layer PF1 may support the first area NBA1 so that a portion of the first area NBA1 is not bent when the substrate SUB is bent. The first support layer PF1 may include a PET film.

The second support layer PF2 may be located below the substrate SUB. The second support layer PF2 may be at a portion corresponding to the third area NBA2. On a plane, at least a portion of the second support layer PF2 may overlap a portion of the circuit board FP. On the plane, a portion of the second support layer PF2 may overlap a portion of the protection layer BPL. The second support layer PF2 may support the substrate SUB so that a portion of the substrate in the third area NBA2 in not bent when the substrate SUB is bent. The second support layer PF2 may include a PET film.

The substrate SUB may be bent with respect to the bending axis BX. The bending axis BX may extend in the second direction DR2. When the substrate SUB is bent, the first support layer PF1 and the second support layer PF2 may face each other.

As the third area NBA2, in which the driving element IC (refer to FIG. 4) is located, is arranged on the rear surface of the first area NBA1, the display device DD (refer to FIG. 1) according to an embodiment of the present disclosure may realize a narrow bezel.

Figure 8:
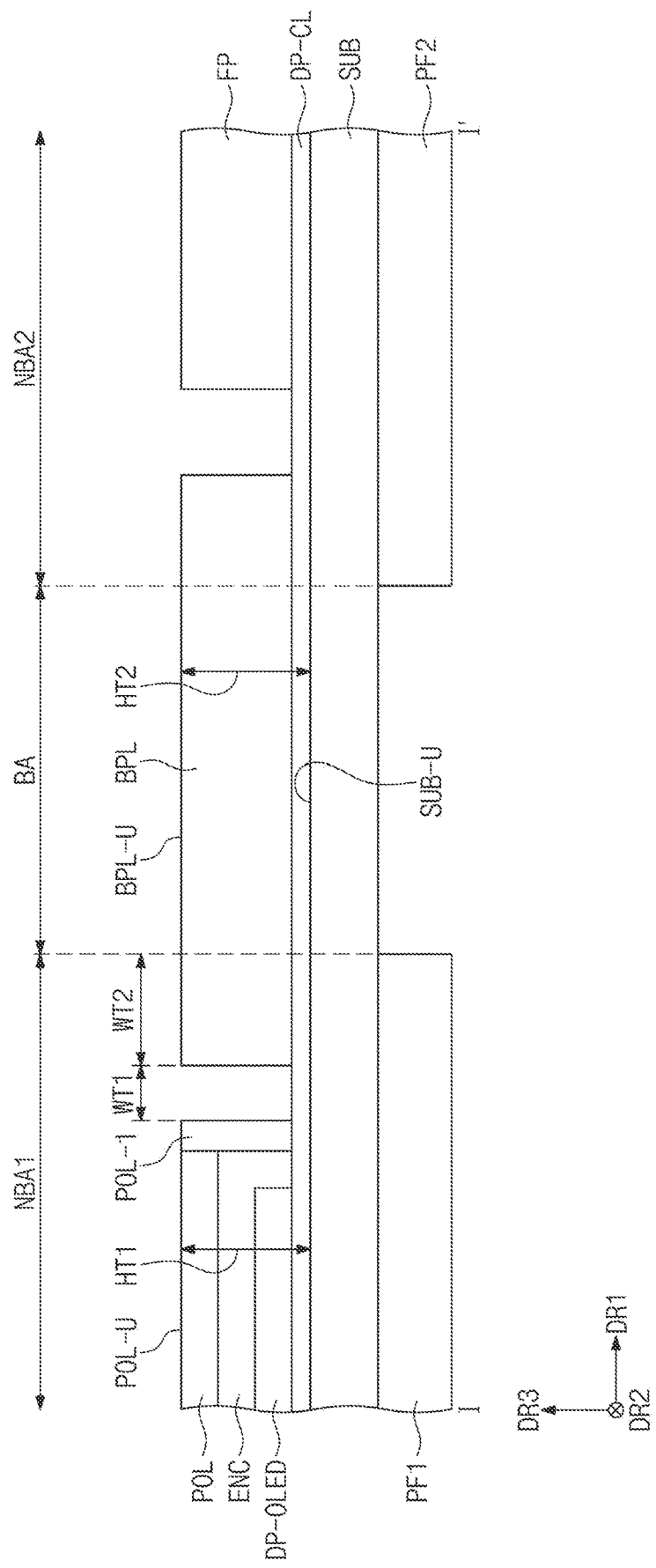
FIG. 8 is a cross-sectional view illustrating the display device taken along the line I-I' in FIG. 4 according to an embodiment of the present disclosure.

FIG. 8 is a cross-sectional view illustrating a display device taken along the line I-I' in FIG. 4 according to an embodiment of the present disclosure. The components described in FIGS. 7A and 7B will be designated by the same reference numerals, respectively, and repeated description for the components will be omitted.

Referring to FIG. 8, the display device DD (refer to FIG. 1) may further include a polarizing layer POL-1. The first polarizing layer POL-1 may be on a side surface of the encapsulation layer ENC. The first polarizing layer POL-1 may cover the entire side surface of the encapsulation layer ENC. The first polarizing layer POL-1 may be integrated with the polarizing layer POL. The polarizing layer POL and the first polarizing layer POL-1 may cover the encapsulation layer ENC.

Figure 9:
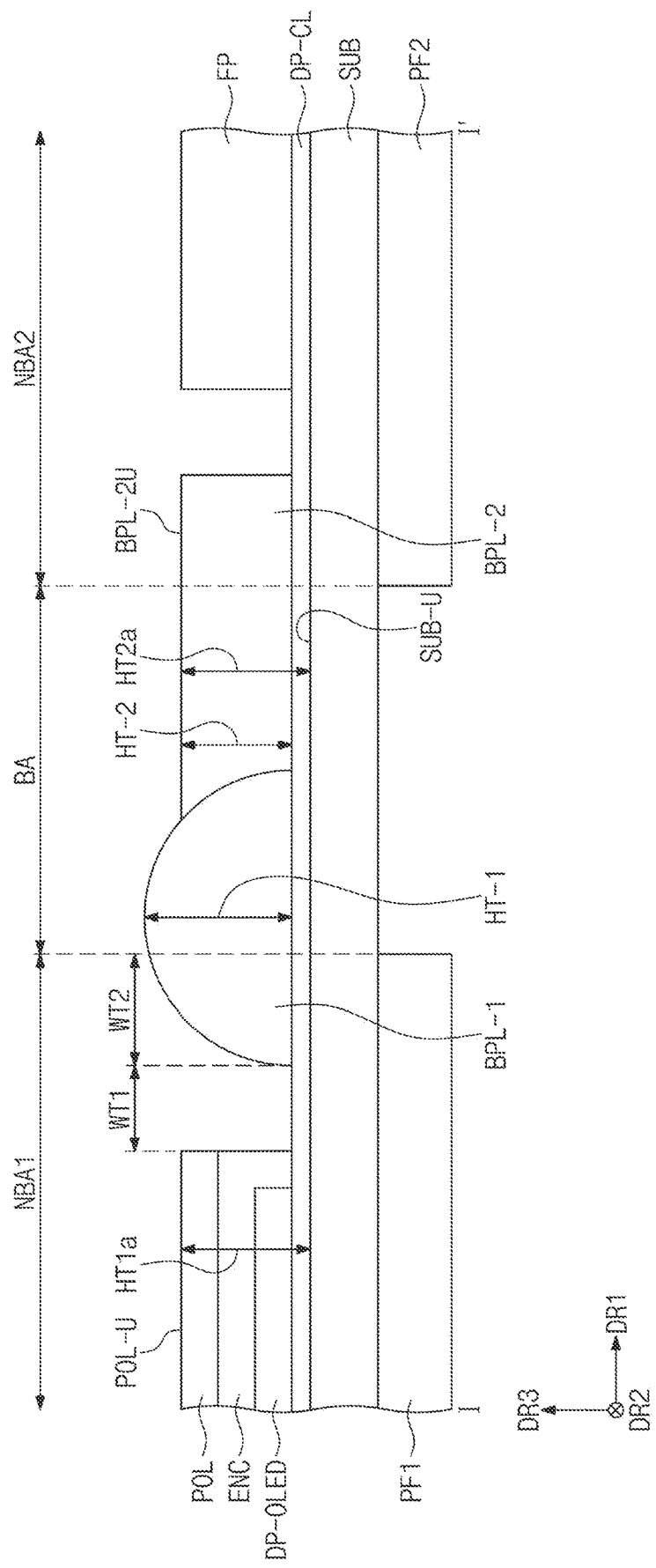
FIG. 9 is a cross-sectional view illustrating a display device taken along the line I-I' in FIG. 4 according to an embodiment of the present disclosure.

FIG. 9 is a cross-sectional view illustrating a display device taken along the line I-I' in FIG. 4 according to an embodiment of the present disclosure. The components described in FIGS. 7A and 7B will be designated by the same reference numerals, respectively, and repeated description for the components will be omitted.

Referring to FIG. 9, a first protection layer BPL-1 may be on the substrate SUB. The first protection layer BPL-1 may be spaced apart from the polarizing layer POL in the first direction DR1. The first protection layer BPL-1 may be spaced apart from the encapsulation layer ENC and the light emitting element layer DP-OLED in the first direction DR1.

A second protection layer BPL-2 may be on the substrate SUB. The second protection layer BPL-2 may be at at least a portion of the third area NBA2 and the second area BA.

The first protection layer BPL-1 may be located between the polarizing layer POL and the second protection layer BPL-2. The second protection layer BPL-2 may cover a portion of the first protection layer BPL-1.

The first protection layer BPL-1 may have a thickness HT-1 in the third direction DR3, which is greater than a thickness HT-2 of the second protection layer BPL-2 in the third direction DR3. Accordingly, the second protection layer BPL-2 may not pass by the first protection layer BPL-1 due to the thickness HT-1 of the first protection layer BPL-1, and may not be located between the polarizing layer POL and the first protection layer BPL-1. The first protection layer BPL-1 may allow the second protection layer BPL-2 to be spaced apart from the polarizing layer POL. The first protection layer BPL-1 and the second protection layer BPL-2 may be spaced apart from the polarizing layer POL in the first direction DR1. For example, the width WT1 between the first protection layer BPL-1 and the polarizing layer POL may be about 10 μm or more.

According to an embodiment of the present disclosure, the first protection layer BPL-1 and the second protection layer BPL-2 may be spaced apart from the polarizing layer POL. The protection film POL-P (refer to FIG. 10) for protecting the polarizing layer POL may be on a top surface of the polarizing layer POL. The first protection layer BPL-1 may be spaced apart from the protection film POL-P (refer to FIG. 10). Thus, the protection layer BPL-1 may be prevented from protruding further than the polarizing layer POL by contacting with the protection film POL-P (refer to FIG. 10) and the polarizing layer POL by a surface tension with the protection film POL-P (refer to FIG. 10). Also, the window at the polarizing layer POL may be prevented from being curved/deformed by protruded protection layer BPL-1, and the product reliability of the display device DD (refer to FIG. 1) may improve.

On the plane, at least a portion of the first area NBA1 may overlap at least a portion of the first protection layer BPL-1. For example, a width WT2 of an overlapped area in which the first area NBA1 overlaps the first protection layer BPL-1 may be in a range from about 140 μm to about 550 μm.

For example, unlike the present embodiment, when the width WT2 of the overlapped area in which the first area NBA1 overlaps the first protection layer BPL-1 is less than about 140 μm, the first protection layer BPL-1 may not be sufficiently adhered to the substrate SUB, and the first protection layer BPL-1 may be separated from the substrate SUB by a force applied when the substrate SUB is bent. However, according to the present embodiment, when the width WT2 is about 140 μm or more, the first protection layer BPL-1 may be sufficiently adhered to the substrate SUB in the first area NBA1. The first protection layer BPL-1 and the second protection layer BPL-2 may allow a neutral surface to be provided at the circuit element layer DP-CL when the substrate SUB is bent. The first protection layer BPL-1 and the second protection layer BPL-2 may prevent a crack from being generated in the circuit element layer DP-CL. Thus, the display device DD (refer to FIG. 1) may have improved reliability and improved display quality.

As an example, and unlike the present embodiment, when the width WT2 of the overlapped area between the first area NBA1 and the first protection layer BPL-1 exceeds about 550 μm on the plane, the first protection layer BPL-1 may contact the polarizing layer POL. The protection film POL-P (refer to FIG. 10) for protecting the polarizing layer POL may be on a top surface of the polarizing layer POL. The first protection layer BPL-1 may contact the protection film POL-P (refer to FIG. 10). And the polarizing layer POL may protrude further than the polarizing layer POL by a surface tension with the protection film POL-P (refer to FIG. 10). Thus, the window at the polarizing layer POL may be curved/deformed by protruded protection layer BPL-1. However, according to the present disclosure, because the polarizing layer POL and the protection layer BPL are spaced apart from each other, the protection layer BPL may be prevented from protruding further than the polarizing layer POL by the surface tension with the protection film POL-P (refer to FIG. 10). That is, the window at the polarizing layer POL may be prevented from being curved/deformed by protruded protection layer BPL. Thus, the product reliability of the display device DD (refer to FIG. 1) may improve.

A portion of the first protection layer BPL-1 may be at the first area NBA1, and may overlap the first support layer PF1. The first protection layer BPL-1 may secure an overlapped area with the first support layer PF1. For example, the width WT2 of the overlapped area may be in a range from about 140 μm to about 550 μm.

Figure 10:
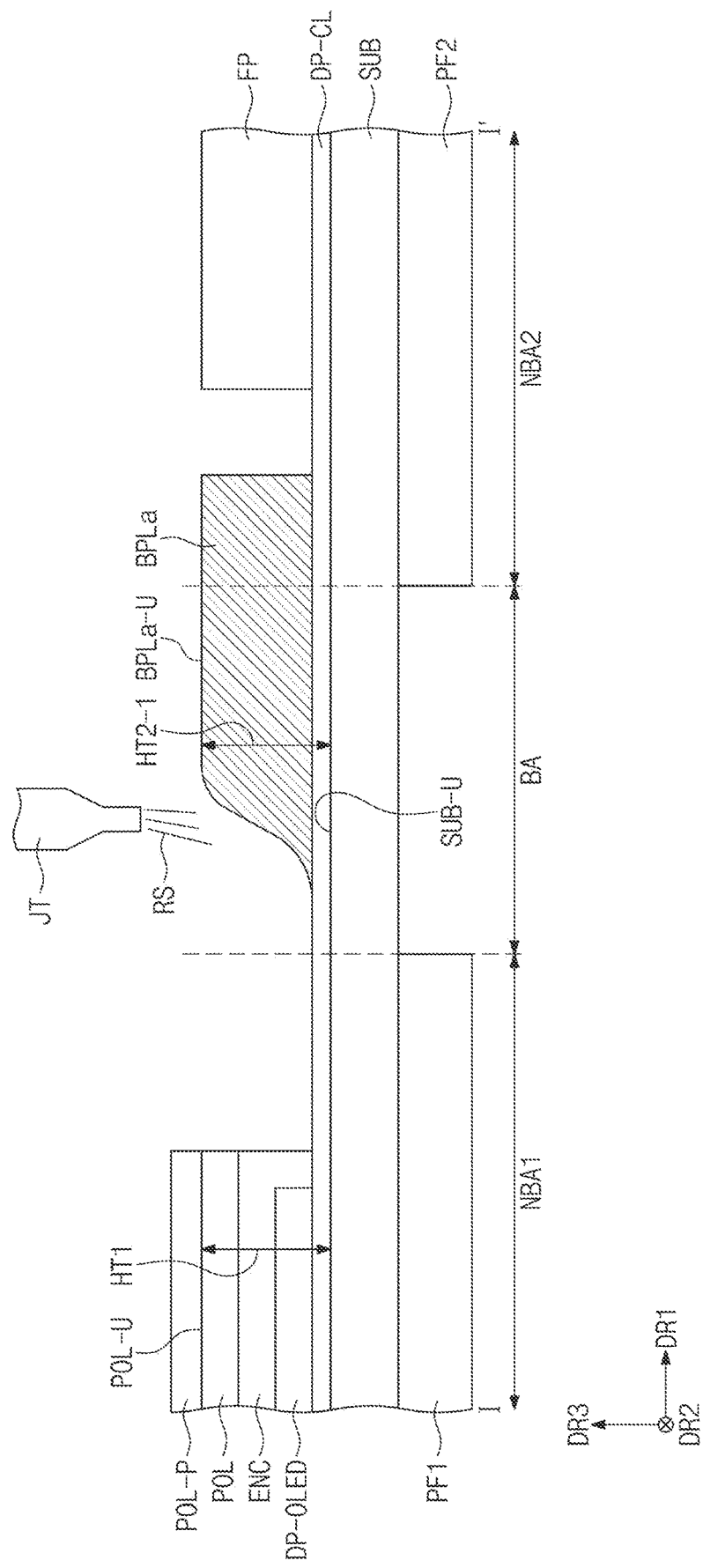
FIGS. 10 and 11 are cross-sectional views illustrating a method of manufacturing the display device according to an embodiment of the present disclosure.

FIG. 10 is a cross-sectional view illustrating a portion of a process of forming a preliminary protection layer according to an embodiment of the present disclosure. The components described in FIGS. 7A and 8 will be designated by the same reference numerals, respectively, and repeated description for the components will be omitted.

Referring to FIG. 10, a light emitting element layer DP-OLED may be formed on a substrate SUB. An encapsulation layer ENC may be formed on the light emitting element layer DP-OLED. A polarizing layer POL may be formed on the encapsulation layer ENC. A protection film POL-P for protecting a top surface of the polarizing layer POL may be on the polarizing layer POL.

A preliminary protection layer BPLa may be formed on the substrate SUB. The preliminary protection layer BPLa may include a resin. For example, the preliminary protection layer BPLa may include an organic resin, such as an acrylic resin. However, the present disclosure is not limited thereto.

The preliminary protection layer BPLa may be applied on the substrate SUB through a jetting device JT. The jetting device JT may jet a resin RS. The jetting device JT may apply the resin RS in the first direction DR1 and in the second direction DR2.

The jetting device JT may apply the resin RS so that the preliminary protection layer BPLa is at at least a portion of the first area NBA1, at at least a portion of the third area NBA2, and at the second area BA.

The jetting device JT may apply the resin RS so that a thickness HT1 between a top surface SUB-U of the substrate SUB and a top surface POL-U of the polarizing layer POL is the same as a thickness HT2-1 between the top surface SUB-U of the substrate SUB and a top surface BPLa-U of the preliminary protection layer BPLa.

The jetting device JT may apply the resin RS so that the polarizing layer POL is spaced apart from the preliminary protection layer BPLa.

The jetting device JT may apply the resin RS so that a circuit board FP is spaced apart from the preliminary protection layer BPLa.

Figure 11:
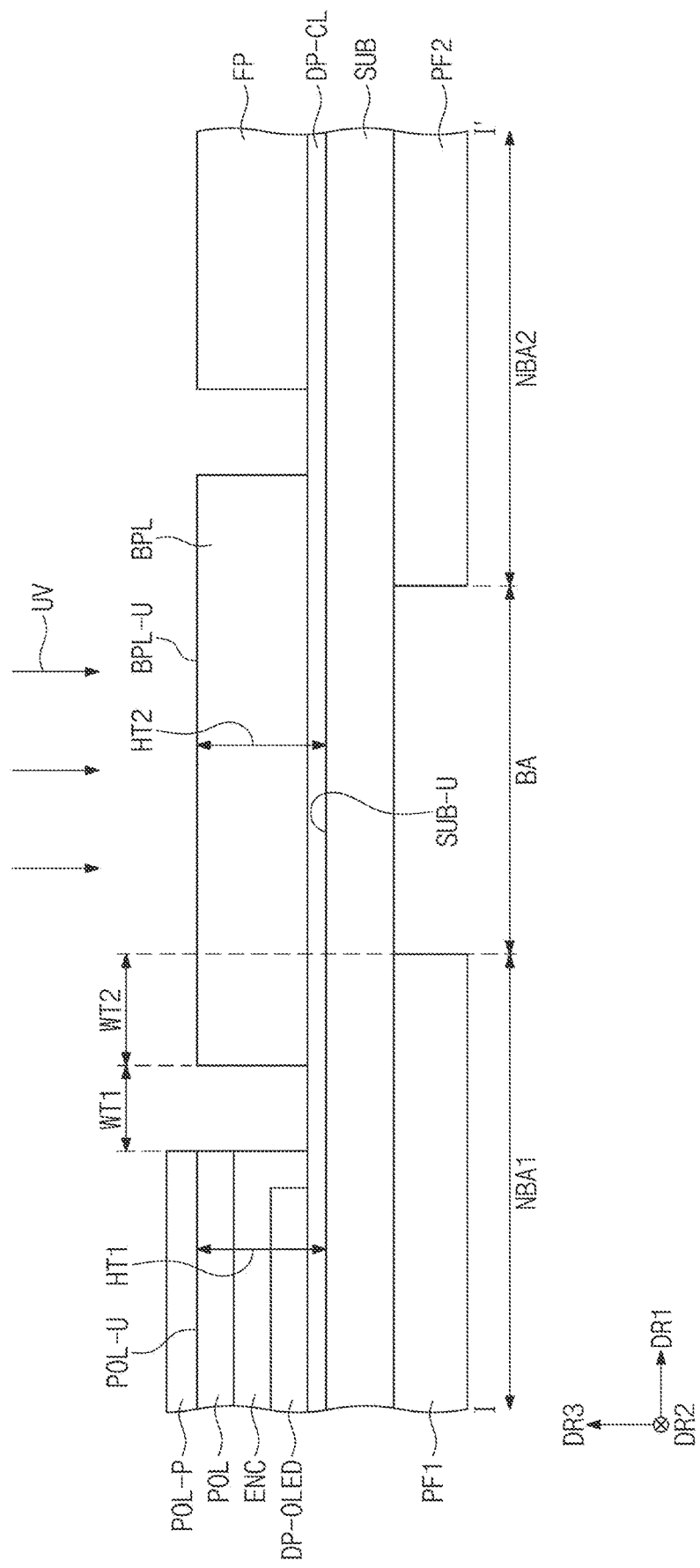

FIG. 11 is a cross-sectional view illustrating a portion of a process of forming a protection layer according to an embodiment of the present disclosure. The components described in FIGS. 7A to 8 and 10 will be designated by the same reference numerals, respectively, and repeated description for the components will be omitted.

Referring to FIGS. 10 and 11, the preliminary protection layer BPLa may be cured by irradiating the preliminary protection layer BPLa with light UV. As the preliminary protection layer BPLa is cured, the protection layer BPL may be formed.

The preliminary protection layer BPLa may include a UV curable resin, a thermally curable resin, or an electron beam curable resin.

For example, when the preliminary protection layer BPLa is the UV curable resin, the light UV may be ultraviolet rays, when the preliminary protection layer BPLa is the electron beam curable resin, the light UV may be an electron beam, and when the preliminary protection layer BPLa is the thermally curable resin, heat may be applied to cure the preliminary protection layer BPLa.

The protection layer BPL may be spaced apart from the polarizing layer POL in the first direction DR1. For example, a width WT1 between the protection layer BPL and the polarizing layer POL may be about 10 μm or more.

According to an embodiment of the present disclosure, the preliminary protection layer BPLa may be spaced apart from the polarizing layer POL. The preliminary protection layer BPLa may be spaced apart from the protection film POL-P. The protection layer BPLa may be prevented from protruding further than the polarizing layer POL by contacting with the protection film POL-P and the polarizing layer POL by a surface tension with the protection film POL-P. Thus, the window at the polarizing layer POL may be prevented from being curved/deformed by protruded protection layer BPLa, and the product reliability of the display device DD (refer to FIG. 1) may improve The protection film POL-P may be removed before the window is formed.

The preliminary protection layer BPLa may be cured to overlap the first area NBA1 on the plane. The protection layer BPL may secure an overlapped area with the first area NBA1. For example, the width WT2 of the overlapped area may be in a range from about 140 μm to about 550 μm. The preliminary protection layer BPLa may overlap the first support layer PF1 on the plane.

According to an embodiment of the present disclosure, the protection layer BPL may be sufficiently adhered to the substrate SUB. The protection layer BPL may allow a neutral surface to be formed in the circuit element layer DP-CL, thereby preventing a crack from being generated in the circuit element layer DP-CL. Thus, a reliability the display device DD (refer to FIG. 1) may improve.

Figure 12:
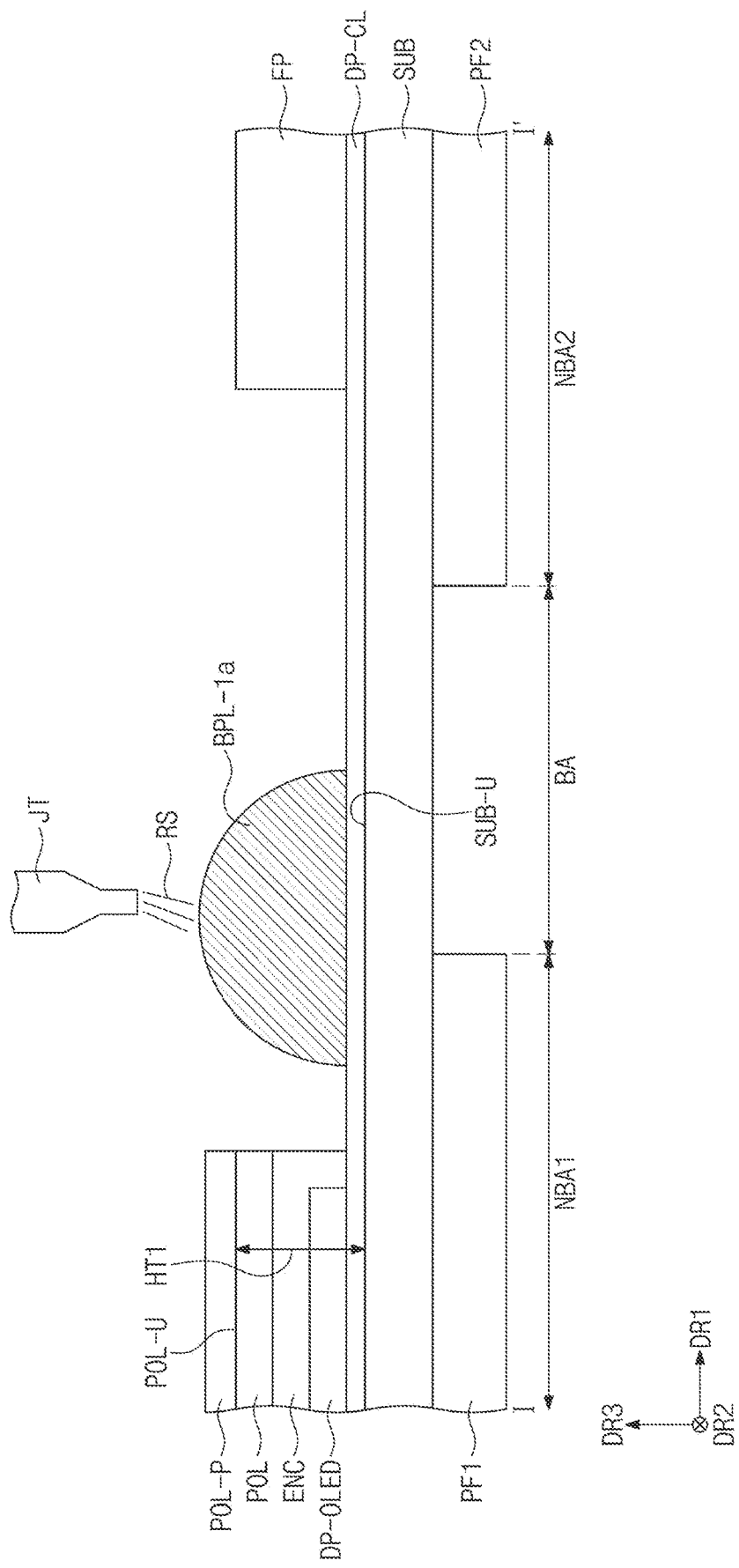
FIGS. 12 to 15 are cross-sectional views illustrating a method of manufacturing the display device according to an embodiment of the present disclosure.

FIG. 12 is a cross-sectional view illustrating a portion of a process of forming a first preliminary protection layer according to an embodiment of the present disclosure. The components described in FIG. 9 will be designated by the same reference numerals, respectively, and repeated description for the components will be omitted.

Referring to FIG. 12, a first preliminary protection layer BPL-la may be formed on the substrate SUB. The first preliminary protection layer BPL-la may include a resin. For example, the first preliminary protection layer BPL-la may include an organic resin such as an acrylic resin. However, the present disclosure is not limited thereto.

The first preliminary protection layer BPL-la may be applied on the substrate SUB through the jetting device JT. The jetting device JT may jet the resin RS. The jetting device JT may apply the resin RS in the first direction DR1 and the second direction DR2.

The jetting device JT may apply the resin RS so that the polarizing layer POL and the first preliminary protection layer BPL-la are spaced apart from each other.

Figure 13:
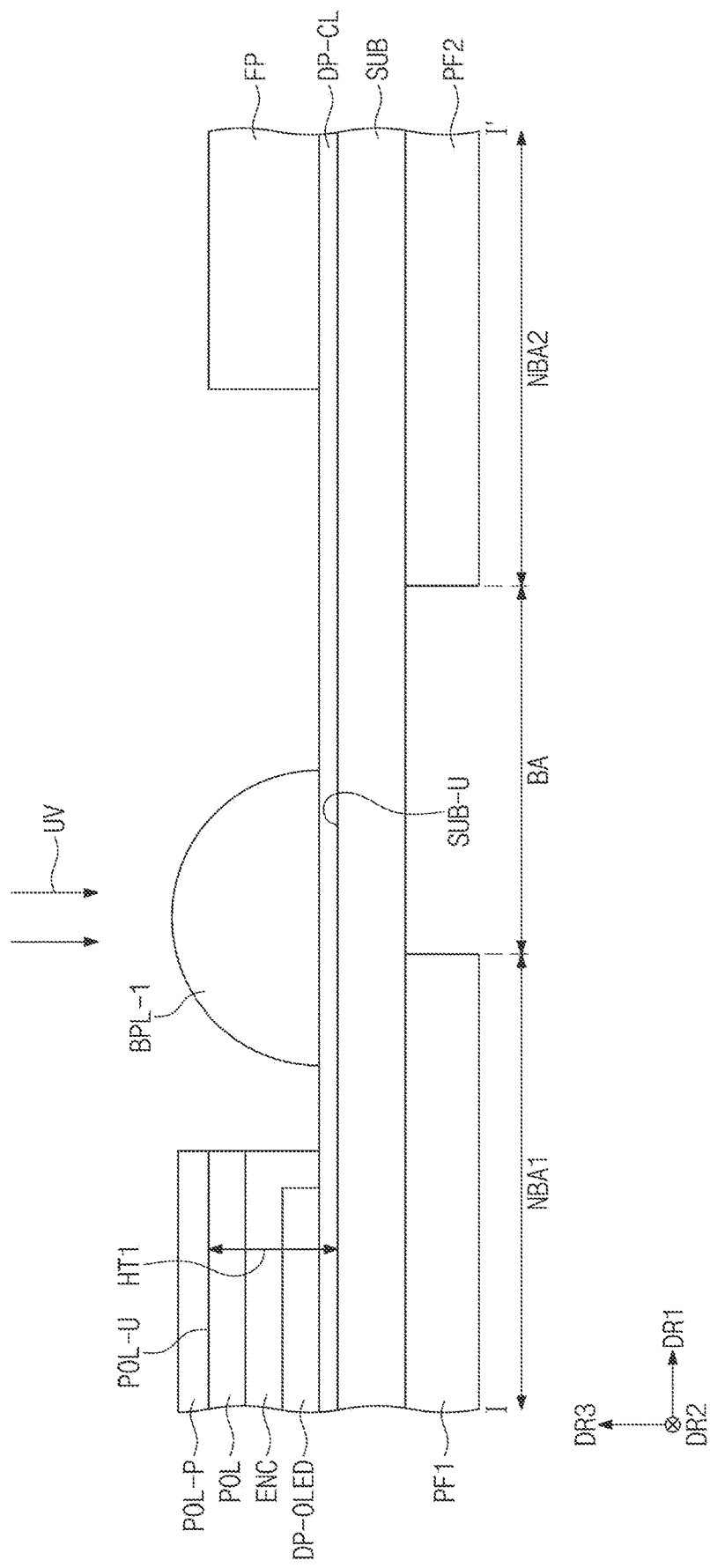

FIG. 13 is a cross-sectional view illustrating a portion of a process of forming a first preliminary protection layer according to an embodiment of the present disclosure. The components described in FIGS. 9 and 12 will be designated by the same reference numerals, respectively, and repeated description for the components will be omitted Referring to FIGS. 12 and 13, the first preliminary protection layer BPL-la may be cured by irradiating the first preliminary protection layer BPL-la with light UV. As the first preliminary protection layer BPL-la is cured, the first protection layer BPL-1 may be formed.

The first preliminary protection layer BPL-la may include a UV curable resin, a thermally curable resin, or an electron beam curable resin.

For example, when the preliminary protection layer BPL-la is the UV curable resin, the light UV may be ultraviolet rays, when the preliminary protection layer BPL-la is the electron beam curable resin, the light UV may be an electron beam, and when the preliminary protection layer BPL-la is the thermally curable resin, heat may be applied to cure the preliminary protection layer BPL-la.

The first protection layer BPL-1 may be spaced apart from the polarizing layer POL in the first direction DR1.

Figure 14:
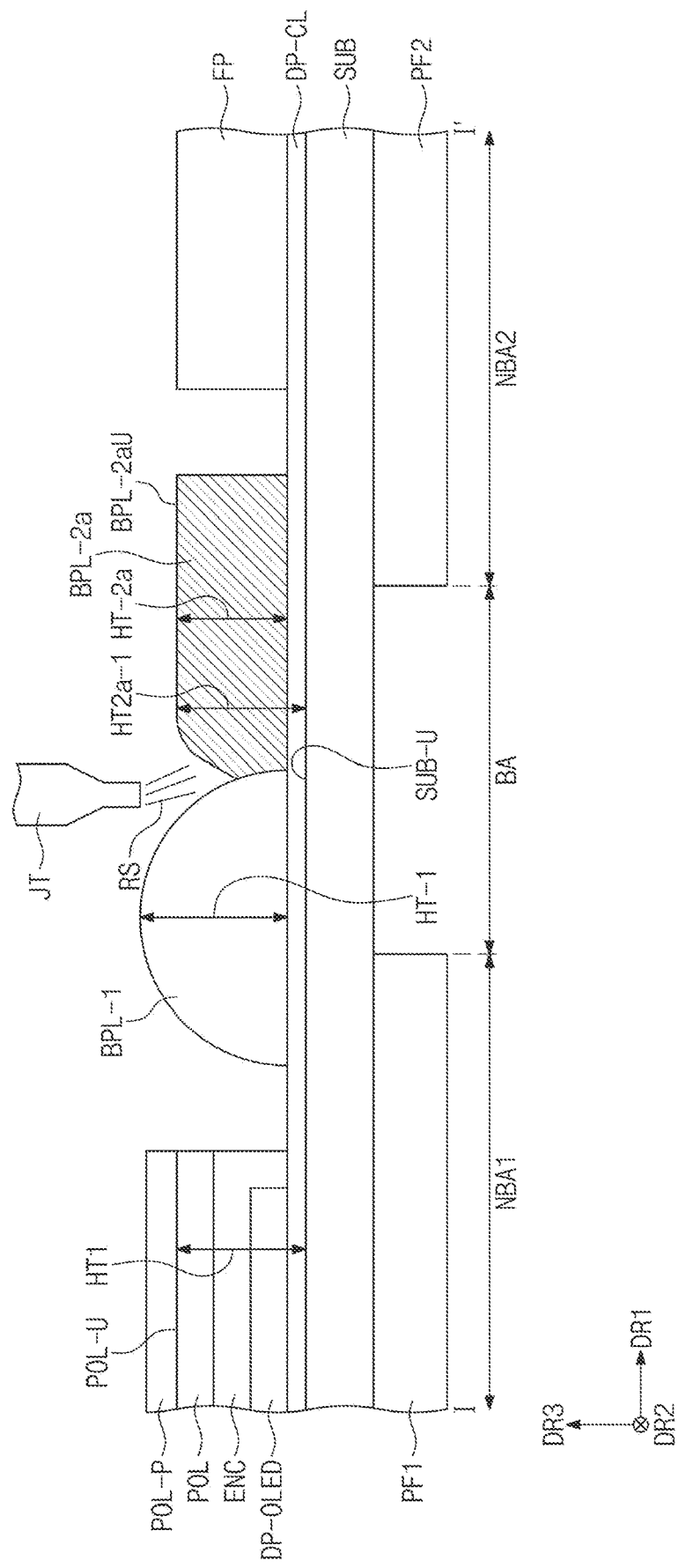

FIG. 14 is a cross-sectional view illustrating a portion of a process of forming a second preliminary protection layer according to an embodiment of the present disclosure. The components described in FIGS. 9, 12, and 13 will be designated by the same reference numerals, respectively, and repeated description for the components will be omitted.

Referring to FIG. 14, a second preliminary protection layer BPL-2a may be formed on the substrate SUB. The second preliminary protection layer BPL-2a may include substantially the same material as the first preliminary protection layer BPL-la.

The second preliminary protection layer BPL-2a may be applied on the substrate SUB through the jetting device JT.

The jetting device JT may apply the resin RS so that the first protection layer BPL-1 is located between the polarizing layer POL and the second preliminary protection layer BPL-2a.

The jetting device JT may apply the resin RS so that the second preliminary protection layer BPL-2a is at the second area BA, and at at least a portion of the third area NBA2.

The second preliminary protection layer BPL-2a may have a thickness HT-2a in the third direction DR3, which is less than a thickness HT-1 of the first protection layer BPL-1 in the third direction DR3. Due to the thickness HT-1 of the first protection layer BPL-1, the second preliminary protection layer BPL-2a may not pass by the first protection layer BPL-1, and may not be applied between the first protection layer BPL-1 and the polarizing layer POL. The first protection layer BPL-1 may allow the second preliminary protection layer BPL-2a to not contact the polarizing layer POL. The jetting device JT may apply the resin RS so that the polarizing layer POL and the second preliminary protection layer BPL-2a are spaced apart from each other. The jetting device JT may apply the resin RS so that the circuit board FP and the second preliminary protection layer BPL-2a are spaced apart from each other.

Figure 15:
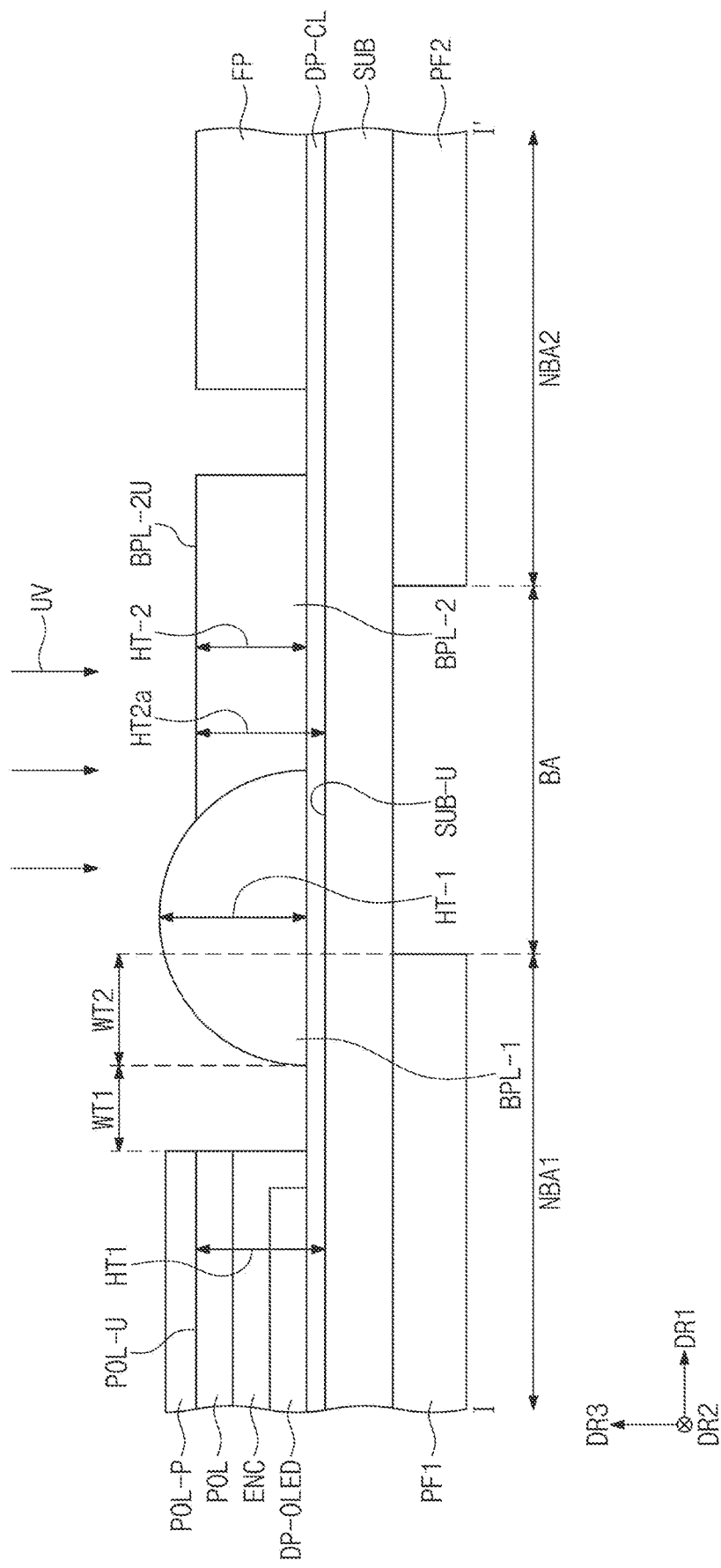

FIG. 15 is a cross-sectional view illustrating a portion of a process of forming a second preliminary protection layer according to an embodiment of the present disclosure. The components described in FIGS. 9 and 12 to 14 will be designated by the same reference numerals, respectively, and repeated description for the components will be omitted.

Referring to FIGS. 14 and 15, a second preliminary protection layer BPL-2a may be cured by irradiating the second preliminary protection layer BPL-2a with light UV. As the second preliminary protection layer BPL-2a is cured, the second protection layer BPL-2 may be formed.

The first protection layer BPL-1 may be hardened by irradiating the first protection layer BPL-1 with light UV.

The first protection layer BPL-1 and the second protection layer BPL-2 may be spaced apart from the polarizing layer POL in the first direction DR1.

According to an embodiment of the present disclosure, the first protection layer BPL-1 may be spaced apart from the polarizing layer POL. The second protection layer BPL-2 may be spaced apart from the protection film POL-P. Thus, the second protection layer BPL-2 may be prevented from protruding further than the polarizing layer POL by contacting with the protection film POL-P and the polarizing layer POL by a surface tension with the protection film POL-P. The window at the polarizing layer POL may be prevented from being curved/deformed by protruded protection layer BPL-2. Thus, the product reliability of the display device DD (refer to FIG. 1) may improve.

The protection film POL-P may be removed before the window is formed.

On the plane, a portion of the first protection layer BPL-1 may overlap the first area NBA1. On the plane, a portion of the first protection layer BPL-1 may overlap the first support layer PF1.

According to an embodiment of the present disclosure, the first protection layer BPL-1 and the second protection layer BPL-2 may allow a neutral surface to be formed at the circuit element layer DP-CL. The first protection layer BPL-1 and the second protection layer BPL-2 may prevent a crack from being generated in the circuit element layer DP-CL. Thus, the reliability of the display device DD (refer to FIG. 1) may improve.

Figure 16:
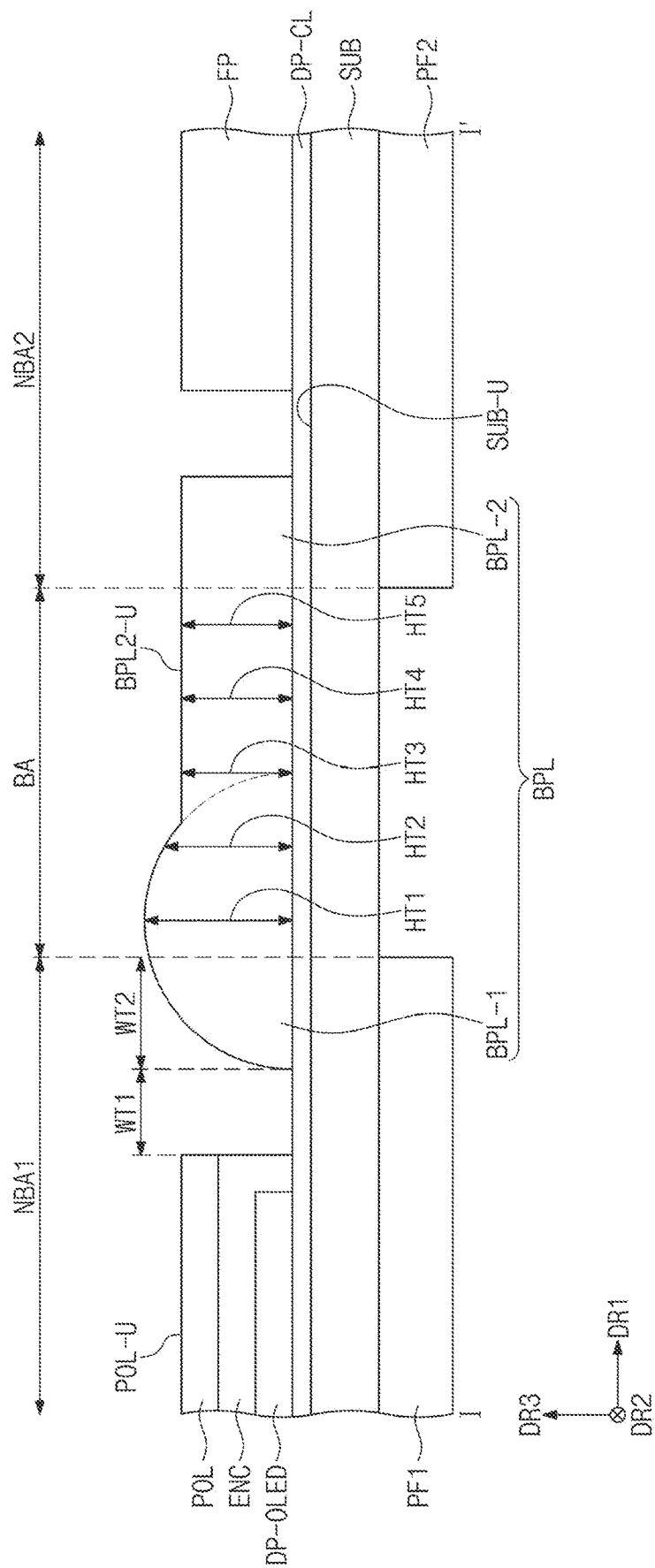
FIG. 16 is an enlarged cross-sectional view illustrating a portion of the display device according to an embodiment of the present disclosure.

FIG. 16 is an enlarged cross-sectional view illustrating a portion of the display device according to an embodiment of the present disclosure.

Referring to FIG. 16, the display device DD (refer to FIG. 1) may include a protection layer BPL. The protection layer BPL may include a first protection layer BPL-1 and a second protection layer BPL-2. The first protection layer BPL-1 and the second protection layer BPL-2 may be integrated with each other. The first protection layer BPL-1 and the second protection layer BPL-2 may be made of substantially the same material as each other.

Each of first to fifth thicknesses HT1 to HT5 may be measured in the second area BA. The first thickness HT1 may be measured at a thickest position (e.g., at a first position) of the protection layer BPL. The first position may be one position of the first protection layer BPL-1. Second to fifth positions, at which the second to fifth thicknesses HT2 to HT5 are respectively measured, may be spaced (e.g., spaced at a predetermined distance) from the first position in a direction away from the polarizing layer POL in the first direction DR1. The first position may be closer to the first area NBA1 than each of the second to fifth positions. The first thickness HT1 may be greater than each of the second to fifth thicknesses HT2, HT3, HT4, and HT5.

Table 1 shows first to fifth thicknesses HT1 to HT5 of each of a plurality of protection layers TT1 to TT9 formed by using the processes of FIGS. 12 to 15.

TABLE T

| Unit: μm | TT1 | TT2 | TT3 | TT4 | TT5 | TT6 | TT7 | TT8 | TT9 | Average |
|---|---|---|---|---|---|---|---|---|---|---|
| HT1 | 93 | 97 | 96 | 98 | 102 | 104 | 98 | 100 | 100 | 99 |
| HT2 | 85 | 85 | 89 | 85 | 86 | 85 | 86 | 85 | 82 | 85 |
| HT3 | 83 | 97 | 89 | 76 | 83 | 79 | 76 | 79 | 78 | 82 |
| HT4 | 85 | 92 | 90 | 73 | 85 | 86 | 84 | 85 | 82 | 85 |
| HT5 | 89 | 96 | 94 | 92 | 91 | 89 | 88 | 90 | 87 | 91 |
| Average | 87 | 93 | 92 | 85 | 89 | 89 | 86 | 88 | 86 | 88 |

Referring to Table 1, the first thickness HT1 of each of the plurality of protection layers TT1 to TT9 may be greater than each of the second to fifth thicknesses HT2 to HT5 of each of the plurality of protection layers TT1 to TT9. An average of thicknesses of the plurality of protection layers TT1 to TT9 may be about 88 μm. Here, a lowest thickness may be about 82 μm. A highest thickness may be about 99 μm. The highest thickness may be the first thickness HT1.

According to embodiments of the present disclosure, the display device may include the polarizing layer and the protection layer, which are on the substrate. The protection film for protecting the polarizing layer may be on the top surface of the polarizing layer. The polarizing layer and the protection film may be spaced apart from the protection layer. Thus, the protection layer may be prevented from protruding further than the polarizing layer by contacting with the protection film and the polarizing layer by a surface tension with the protection film. Thus, the window at the polarizing layer may be prevented from being curved/deformed by protruded protection layer, and the product reliability of the display device may improve.

Although the embodiments of the present invention have been described, it is understood that the present invention should not be limited to these embodiments but various changes and modifications can be made by one ordinary skilled in the art within the spirit and scope of the present invention as hereinafter claimed. Hence, the real protective scope of the present disclosure shall be determined by the technical scope of the accompanying claims, with functional equivalents thereof to be included therein.

What is claimed is:

1. A display device comprising:
a substrate comprising a first area and a second area bent from the first area;
a display element layer on the first area;
an encapsulation layer on the display element layer to seal the display element layer;
a polarizing layer on the encapsulation layer;
a support layer below the first area;
a first protection layer on the first area and the second area; and
a second protection layer on the second area and in contact with the first protection layer.

2. The display device of claim 1, wherein a maximum thickness of the first protection layer is greater than a maximum thickness of the second protection layer.

3. The display device of claim 1, wherein the first protection layer was formed by a first curing process, and wherein the second protection layer was formed by a second curing process different from the first curing process.

4. The display device of claim 3, wherein the second curing process was performed after the first curing process.

5. The display device of claim 1, wherein the first protection layer and the second protection layer comprise a same material.

6. The display device of claim 1, wherein the substrate further comprises a third area spaced apart from the first area with the second area interposed therebetween, and
wherein the first protection layer is not disposed on the third area, and the second protection layer is disposed on the third area.

7. The display device of claim 1, wherein the first protection layer is spaced apart from the polarizing layer.

8. The display device of claim 1, wherein a width of overlapping area of the first area and the first protection layer in a first direction is about 140 μm or more.

9. The display device of claim 1, wherein the support layer does not overlap the second protection layer when viewed in a plan view.

* * * * *